United States Patent
Brittner et al.

(10) Patent No.: US 10,990,304 B2
(45) Date of Patent: Apr. 27, 2021

(54) TWO-DIMENSIONAL SCALABLE VERSATILE STORAGE FORMAT FOR DATA STORAGE DEVICES

(71) Applicant: Western Digital Technologies, Inc., San Jose, CA (US)

(72) Inventors: Rodney Brittner, San Jose, CA (US); Xiaoheng Chen, Dublin, CA (US); Mark Joseph Dancho, Chandler, AZ (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 19 days.

(21) Appl. No.: 16/455,181

(22) Filed: Jun. 27, 2019

(65) Prior Publication Data
US 2020/0409578 A1 Dec. 31, 2020

(51) Int. Cl.
| | |
|---|---|
| *G06F 3/06* | (2006.01) |
| *G06F 11/08* | (2006.01) |
| *G06F 11/10* | (2006.01) |
| *G11C 29/52* | (2006.01) |
| *G11B 20/12* | (2006.01) |

(52) U.S. Cl.
CPC .......... *G06F 3/0632* (2013.01); *G06F 3/0604* (2013.01); *G06F 3/0644* (2013.01); *G06F 3/0659* (2013.01); *G06F 3/0661* (2013.01); *G06F 3/0679* (2013.01); *G06F 11/1068* (2013.01); *G11C 29/52* (2013.01); *G11B 20/1217* (2013.01); *G11B 2020/1238* (2013.01); *G11B 2020/1292* (2013.01)

(58) Field of Classification Search
CPC . G06F 3/06; G06F 11/10; G11B 20/12; G11B 2020/1292
USPC ......................................................... 711/103
See application file for complete search history.

(56) References Cited

U.S. PATENT DOCUMENTS

| | | | |
|---|---|---|---|
| 9,111,578 B1* | 8/2015 | Hassel .................. | G11B 5/012 |
| 9,768,808 B2 | 9/2017 | Sprouse et al. | |
| 2004/0246616 A1* | 12/2004 | Yun ..................... | G11B 5/59633 360/75 |
| 2011/0209028 A1* | 8/2011 | Post .................... | G06F 12/0246 714/758 |
| 2012/0038997 A1* | 2/2012 | Jia ..................... | G11B 20/10009 360/31 |
| 2013/0343131 A1* | 12/2013 | Wu ........................ | G11C 16/26 365/185.24 |

(Continued)

*Primary Examiner* — Christopher B Shin
(74) *Attorney, Agent, or Firm* — Loza & Loza, LLP; Gabriel Fitch

(57) ABSTRACT

The present disclosure, in various aspects, describes technologies and techniques for use by a data storage device that includes a controller of a non-volatile memory (NVM). In one example, the controller applies a default storage format to a storage region of the NVM, the default storage format configuring the storage region as a number of distinct storage regions logically arranged along a horizontal dimension and a vertical dimension. The controller modifies the default storage format using a combination of horizontal dimension scaling and vertical dimension scaling based on a performance capability of the storage region to obtain a modified storage format. The controller applies the modified storage format to the storage region.

22 Claims, 12 Drawing Sheets

(56) References Cited

U.S. PATENT DOCUMENTS

| | | | |
|---|---|---|---|
| 2014/0108703 A1* | 4/2014 | Cohen | G06F 3/0655 |
| | | | 711/103 |
| 2016/0299812 A1 | 10/2016 | Olbrich et al. | |
| 2016/0299844 A1 | 10/2016 | Sprouse et al. | |

* cited by examiner

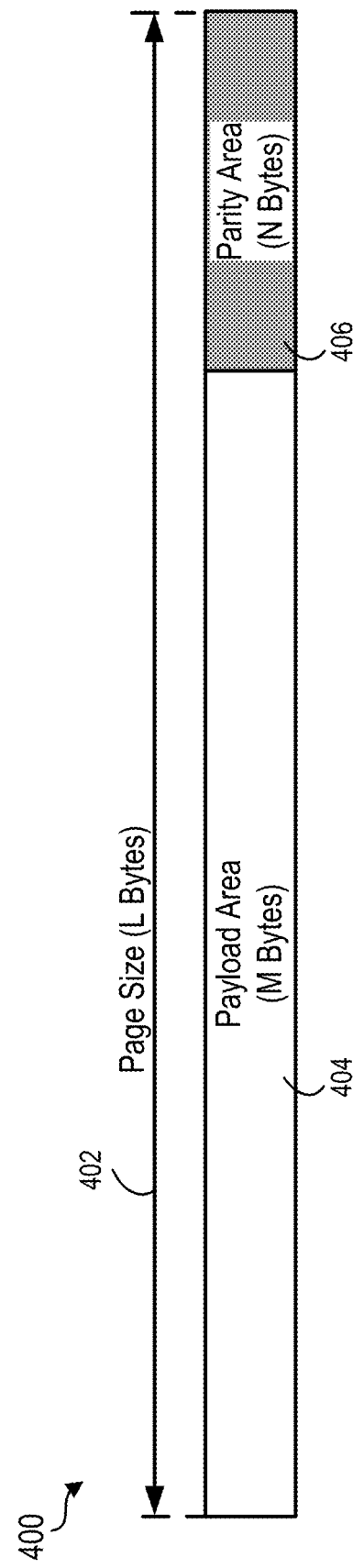
FIG. 3
FIG. 4

TWO-DIMENSIONAL SCALABLE VERSATILE STORAGE FORMAT FOR DATA STORAGE DEVICES

FIELD

The present disclosure, in various embodiments, relates to data storage devices. More specifically, the present disclosure relates to a two-dimensional scalable versatile storage format for data storage devices.

INTRODUCTION

Data storage devices, such as solid state devices (SSDs) or hard disk drives (HDDs), may include non-volatile memories (NVMs). NVMs may include one or more flash memory devices, such as NAND flash memories. Due to high error rates that occur when reading or writing data from NAND flash memories, error correction procedures (e.g., error correction codes (ECCs) and algorithms) may be used to improve SSD reliability and data integrity. In some situations, however, the manner in which the error correction procedures are applied to the NAND flash memories may reduce the performance and longevity of SSDs.

SUMMARY

One aspect of the present disclosure provides a data storage apparatus. In one example, the data storage apparatus comprises a non-volatile memory (NVM) and a processor coupled to the NVM. The processor is configured to apply a default storage format to a storage region of the NVM, the default storage format configuring the storage region as a number of distinct storage regions logically arranged along a horizontal dimension and a vertical dimension; modify the default storage format using a combination of horizontal dimension scaling and vertical dimension scaling based on a performance capability of the storage region to obtain a modified storage format; and apply the modified storage format to the storage region.

Another aspect of the present disclosure provides a data storage apparatus. In one example, the data storage apparatus comprises means for applying a default storage format to a storage region of an NVM, the default storage format configuring the storage region as a number of distinct storage regions logically arranged along a horizontal dimension and a vertical dimension; means for modifying the default storage format using a combination of horizontal dimension scaling and vertical dimension scaling based on a performance capability of the storage region to obtain a modified storage format; and means for applying the modified storage format to the storage region.

Another aspect of the present disclosure provides a method of operating a data storage apparatus. In one example, the method includes applying a default storage format to a storage region of an NVM, the default storage format configuring the storage region as a number of distinct storage regions logically arranged along a horizontal dimension and a vertical dimension; modifying the default storage format using a combination of horizontal dimension scaling and vertical dimension scaling based on a performance capability of the storage region to obtain a modified storage format; and applying the modified storage format to the storage region.

Another aspect of the present disclosure provides a data storage apparatus. In one example, the data storage apparatus comprises an NVM and a processor coupled to the NVM. The processor is configured to apply a first storage format to a page of a block in the NVM, wherein the storage format configures the page into a first number of logical pages; determine a second storage format for the page when a bit error rate for the page exceeds a threshold, wherein the second storage format configures the page into a second number of logical pages, the second number of logical pages being less than the first number of logical pages; and apply the second storage format to the page.

Another aspect of the present disclosure provides a data storage apparatus. In one example, the data storage apparatus comprises means for applying a first storage format to a page of a block in an NVM, wherein the storage format configures the page into a first number of logical pages; means for determining a second storage format for the page when a bit error rate for the page exceeds a threshold, wherein the second storage format configures the page into a second number of logical pages, the second number of logical pages being less than the first number of logical pages; and mean for applying the second storage format to the page.

Another aspect of the present disclosure provides a method of operating a data storage apparatus. In one example, the method includes applying a first storage format to a page of a block in an NVM, wherein the storage format configures the page into a first number of logical pages; determining a second storage format for the page when a bit error rate for the page exceeds a threshold, wherein the second storage format configures the page into a second number of logical pages, the second number of logical pages being less than the first number of logical pages; and applying the second storage format to the page.

Another aspect of the present disclosure provides a data storage apparatus. In one example, the data storage apparatus comprises an NVM and a processor coupled to the NVM. The processor is configured to monitor a bit error rate of a plurality of storage regions of the NVM, each of the plurality of storage regions having a storage format; identify one or more of the plurality of storage regions having a bit error rate that exceeds a threshold; and dynamically scale the storage format of the one or more of the plurality of storage regions to reduce the bit error rate of the one or more of the plurality of storage regions.

Another aspect of the present disclosure provides a data storage apparatus. In one example, the data storage apparatus comprises an NVM comprising a plurality of storage regions; means for monitoring a bit error rate of a plurality of storage regions of the NVM, each of the plurality of storage regions having a storage format; means for identifying one or more of the plurality of storage regions having a bit error rate that exceeds a threshold; and means for dynamically scaling the storage format of the one or more of the plurality of storage regions to reduce the bit error rate of the one or more of the plurality of storage regions.

Another aspect of the present disclosure provides a method of operating a data storage apparatus. In one example, the method includes monitoring a bit error rate of a plurality of storage regions of an NVM, each of the plurality of storage regions having a storage format; identifying one or more of the plurality of storage regions having a bit error rate that exceeds a threshold; and dynamically scaling the storage format of the one or more of the plurality of storage regions to reduce the bit error rate of the one or more of the plurality of storage regions.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 3 illustrates a first example of a storage space allocation that may be applied to a page of a non-volatile memory (NVM) in accordance with various aspects of the disclosure.

FIG. 4 illustrates a second example of a storage space allocation that may be applied to a page of an NVM in accordance with various aspects of the disclosure.

DETAILED DESCRIPTION

Figure 1:
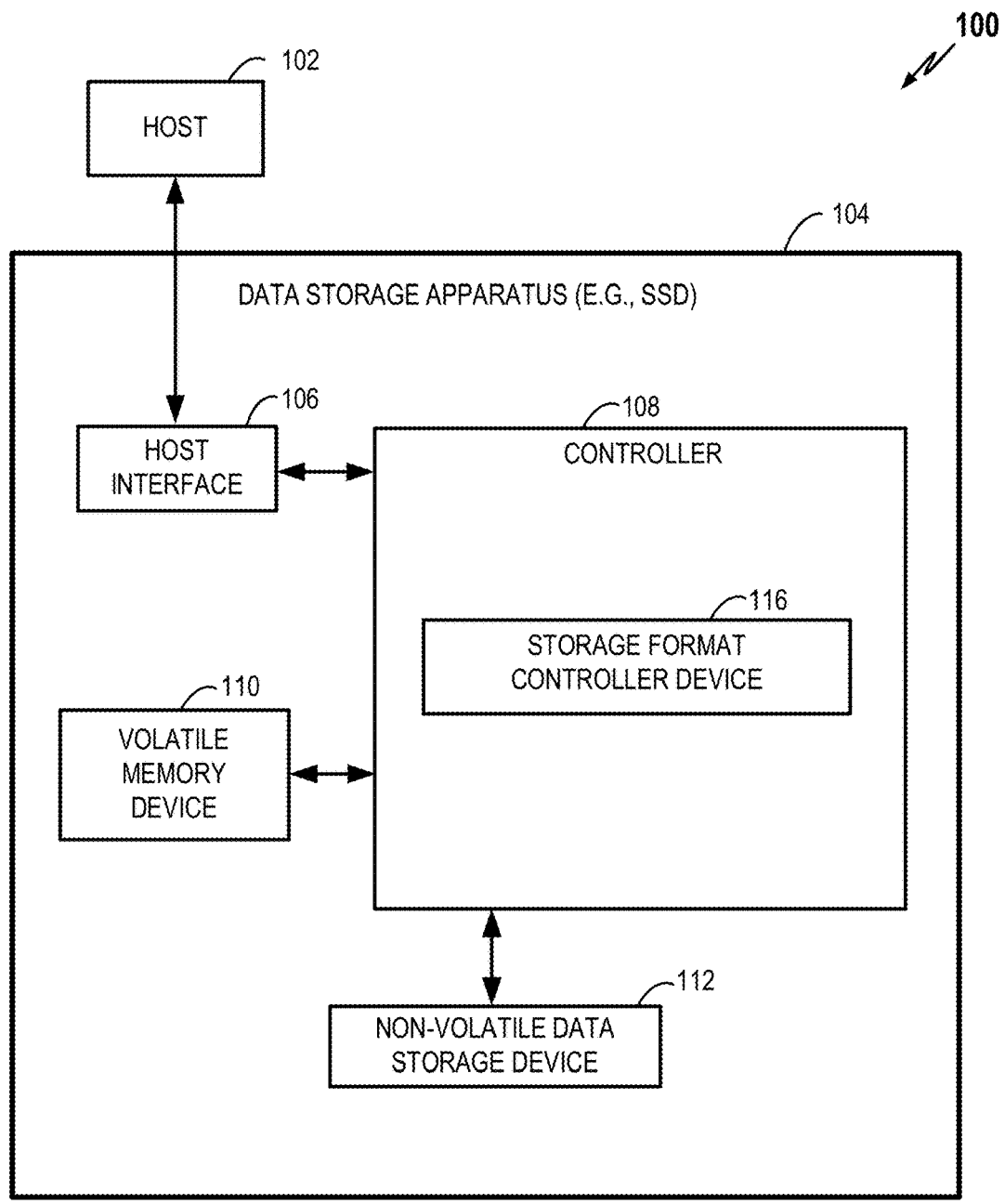
FIG. 1 is a block diagram of a system including an exemplary data storage system in accordance with aspects of the disclosure.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Overview

A data storage system, such as solid state device (SSD), may include a data storage management system to improve the performance and longevity of the non-volatile memories (NVMs) (e.g., NAND flash memories) used in the data storage system. For example, a data storage management system may apply a certain error-correcting code (ECC) rate when storing a set of data bits (also referred to as user bits). This can be achieved by adding a number of parity bits (also referred to as ECC bits) to the set of user bits to form a codeword. For example, n ECC bytes may be added to m data bytes to generate a codeword having m+n bytes. The parity bits in the codeword may be used to correct erroneous user bits in the codeword.

In some data storage management systems, the ECC rate is fixed (also referred to as fixed ECC (FECC)) for the lifetime of the data storage system. This FECC may be designed to deliver a specified sector failure rate (SFR) for the bit error rate (BER) of the NVMs at end of life. For example, the end of life of an NVM may be limited by the BER of a portion of the NVM (e.g., a page in a NAND flash block). Furthermore, the end of life of an NVM may be limited by just a few outlier regions (e.g., NAND flash blocks) of the NVM. For example, such outlier regions of the NVM may include one or more NAND flash blocks with BERs exceeding the average BER of most (or all) the NAND flash blocks in the NVM. These outlier regions of the NVM are unlikely to be recoverable with the default FECC applied by data storage management systems due to the high fail bit count (FBC) of the outlier regions. The FBC indicates a count of erroneous user bits (also referred to as failed user bits), such as bits that erroneously change in value while stored or during a write or read operation.

In some scenarios, advanced wear leveling algorithms may swap out or retire the outlier regions (e.g., NAND flash blocks identified as bad blocks) of the NVM. However, this may reduce the overprovisioning in the data storage system and may jeopardize the overall performance and endurance of the data storage system.

In order to address these problems, the present disclosure presents a two dimensional scalable versatile storage format for a data storage system. In one aspect, this may be embodied in a data storage apparatus including a non-volatile memory (NVM) and a processor coupled to the NVM. The processor can be configured to apply a default storage format to a storage region of the NVM, the default storage format configuring the storage region as a number of distinct storage regions logically arranged along a horizontal dimension and a vertical dimension, modify the default storage format using a combination of horizontal dimension scaling and vertical dimension scaling based on a performance capability of the storage region to obtain a modified storage format, and apply the modified storage format to the storage region. In one aspect, the performance capability may relate to BER and the data storage apparatus can apply scaling to a storage region in the NVM to achieve a BER that prevents one or more storage regions from being considered unusable, thereby improving the longevity of the NVM. Moreover, by scaling down the storage format of a storage region (e.g., page) to improve the reliability of the page, it can be appreciated that the read/write performance (e.g., decoding speed) of the page may also be improved. The approaches presented herein can be applied to both solid state devices (SSDs) and hard disk drives (HDDs).

Example Data Storage System

FIG. 1 illustrates an embodiment of a data storage system 100 that includes a host device 102 and a data storage apparatus 104 communicatively coupled to the host device 102. While the data storage apparatus 104 may be a SSD or a HDD, it will be referred to as an SSD for the description of FIG. 1. The host device (e.g., a host computer) 102 provides commands to the SSD 104 for transferring data between the host device 102 and the SSD 104. For example, the host device 102 may provide a write command to the SSD 104 for writing data to the SSD 104 or a read command to the SSD 104 for reading data from the SSD 104. The host device 102 may be any system or device having a need for data storage or retrieval and a compatible interface for communicating with the SSD 104. For example, the host device 102 may be a computing device, a personal computer, a portable computer, workstation, a server, a personal digital assistant, a digital camera, a digital phone, or the like.

The SSD 104 includes a host interface 106, a controller 108, an optional memory 110, and a non-volatile data storage device 112 (also referred to as NVM 112). The host interface 106 is coupled to the controller 108 and facilitates communication between the host device 102 and the controller 108. Additionally, the controller 108 is coupled to the memory 110 and the NVM 112. For example, the NVM 112 may be a NAND flash memory or a magnetic storage medium.

The host interface 106 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some aspects, the host device 102 includes the SSD 104 (e.g., the host device 102 and the SSD 104 are implemented as a single component). In other embodiments, the SSD 104 is remote with respect to the host device 102 or is contained in a remote computing system coupled in communication with the host device 102. For example, the host device 102 may communicate with the SSD 104 through a wireless communication link.

The controller 108 controls operation of the SSD 104. In various embodiments, the controller 108 receives commands from the host device 102 through the host interface 106 and performs the commands to transfer data between the host device 102 and the NVM 112. As shown in FIG. 1, the controller 108 may include a storage format control device 116. For example, the storage format control device 116 may be configured to apply one or more storage formats to the NVM 112 in accordance with the aspects described in detail herein. The term storage format as used herein may refer to a configuration of distinct storage regions logically arranged along a horizontal dimension and a vertical dimension. In some examples, each of the distinct storage regions may be used to store a codeword that includes data bits and parity bits (e.g., ECC bits). In some examples, the storage format may define the ECC strength, codeword structure, and/or a media format type to be used when generating and storing the codewords. For example, the ECC strength may be quantified in terms of a parity overhead. For example, a codeword structure may refer to a combination of a data payload and an ECC strength.

The controller 108 may perform internal operations such as garbage collection operations, data integrity operations, and wear leveling operations. The controller 108 may include any type of processing device, such as a microprocessor, a microcontroller, an embedded controller, a logic circuit, software, firmware, or the like, for controlling operation of the SSD 104.

In some embodiments, some or all of the functions described herein as being performed by the controller 108 may instead be performed by another element of the SSD 104. For example, the SSD 104 may include a microprocessor, a microcontroller, an embedded controller, a logic circuit, software, firmware, or any kind of processing device, for performing one or more of the functions described herein as being performed by the controller 108. In some embodiments, one or more of the functions described herein as being performed by the controller 108 are instead performed by the host device 102. In some embodiments, some or all of the functions described herein as being performed by the controller 108 may instead be performed by another element such as a controller in a hybrid drive including both non-volatile memory elements and magnetic storage elements.

The memory 110 may be any memory, computing device, or system capable of storing data. For example, the memory 110 may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or the like. In various embodiments, the controller 108 uses the memory 110, or a portion thereof, to store data during the transfer of data between the host device 102 and the NVM 112. For example, the memory 110 or a portion of the memory 110 may be a cache memory. In one aspect, the data storage system 100 is configured for use with the Non-Volatile Memory Express (NVMe) system, where an NVM data storage controller (e.g., controller 108) is configured to control access to an NVM device (e.g., 112) such as a NAND storage device (hereinafter, "NAND") using NVMe protocols. The NVMe system is a scalable host controller interface for use with systems SSDs utilizing Peripheral Component Interconnect (PCI) Express (PCIe). See, e.g., NVM Express standard, Revision 1.3a, Oct. 24, 2017. However, as least some features described herein are applicable to other data storage devices, drives, systems or protocols.

Figure 2:
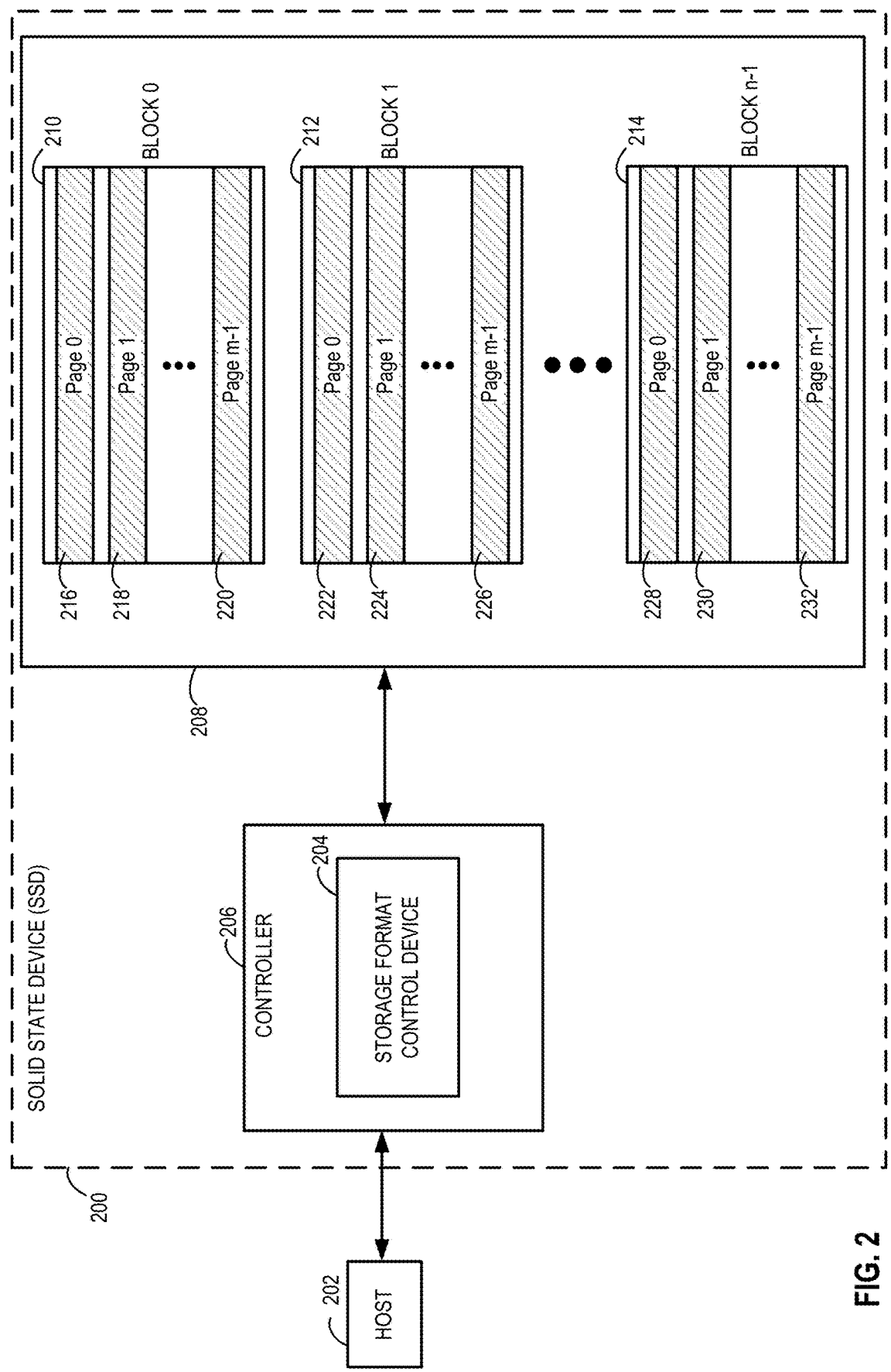
FIG. 2 illustrates an SSD in communication with a host device in accordance with various aspects of the disclosure.

FIG. 2 illustrates a solid state device (SSD) 200 in communication with a host device 202 in accordance with various aspects of the disclosure. As shown in FIG. 2, the SSD 200 may include a controller 206 and an NVM 208. The controller 206 may include a storage format control device 204. The NVM 208 may include one or more NAND blocks, such as the NAND block 0 210, the NAND block 1 212, and the NAND block n−1 214. As further shown in FIG. 2, each NAND block may include a number of pages. For example, the NAND block 0 210 may include a page 0 216, page 1 218, and a page m−1 220, the NAND block 1 212 may include a page 0 222, page 1 224, and a page m−1 226, and the NAND block n−1 214 may include a page 0 228, page 1 230, and a page m−1 232.

Each page (e.g., page 0 216) in FIG. 2 may represent a set of memory cells (also referred to as a wordline). In some aspects of the disclosure, the storage format control device 204 may configure the media format type of the memory cells of a page in the NVM 208. For example, the storage format control device 204 may configure the media format type of the memory cells of a page in the NVM 208 as a single-level cell (SLC) type (e.g., the memory cells of the page may store one bit per cell (1 BPC)), a multi-level cell (MLC) type (e.g., the memory cells of the page may store two bits per cell (2 BPC)), a triple-level cell (TLC) type (e.g., the memory cells of the page may store three bits per cell (3 BPC)), a fractional level cell type (e.g., the memory cells of the page may store 3.5 bits per cell (3.5 BPC)), or a quad-level cell (QLC) type (e.g., the memory cells of the page may store four bits per cell (4 BPC)).

In some aspects of the disclosure, the SSD 200 may contain a greater number of NVMs 208 (e.g., in different NAND flash chips) than shown in FIG. 2. For example, the NVM 208 may include thousands of NAND blocks (e.g., n≥1000) and hundreds of pages (e.g., m≥100) per block. Each NVM (e.g., NVM 208), block (e.g., block 0 210), and page (e.g., page 0 216) may have its own unique error correction code (ECC) requirement to maximize its usefulness to the SSD 200. Such ECC requirement may be determined based on the performance capability of the associated data storage region (e.g., NVM array, block, page, etc.) in the SSD 200. For example, the performance capability (also referred to as status or condition) of a page or block may be determined based on one or more performance metrics of the storage region. In some aspects, the one or more performance metrics may include at least one of a bit error rate (BER), a bit error count, a number of program-erase cycles, an error correction code (ECC) decoding latency, a programming duration, an erase cycle duration, or a read sense duration. For example, the BER may be a function of one or more physical parameters including, but not limited to, semiconductor process variation, wafer location, wordline, media format type (e.g., SLC, MLC, TLC, QLC), program-erase cycles, and disturb effects. For example, the read sense duration may refer to a time period needed for detecting information (e.g., a voltage level corresponding to a bit value or a sequence of bit values) stored in a memory cell during a read operation.

The aspects described herein may enable each data storage region (e.g., NVM array, a block and/or a page) of the NVM 208 to have a unique ECC strength, codeword structure, and/or a media format type. In some aspects of the disclosure, the storage format control device 204 may select the most appropriate storage format for a data storage region (e.g., a block, a page, etc.) to meet the minimum (e.g., worst case) endurance and reliability requirements of the data storage region and a range within the data storage region.

In some aspects of the disclosure, the storage format control device 204 may determine the performance capability (e.g., BER) of a data storage region in the SSD 200. In some aspects of the disclosure, the storage format control device 204 may apply a two-dimensional scalable storage format to the data storage region. The two-dimensional scalable storage format may enable the adaption of the storage format (e.g., including both ECC and media format type) according to the needs of each data storage region (e.g., block, page, etc.) and individual ranges and needs within each data storage region. In some aspects of the disclosure, the storage format control device 204 may select a storage format that maximizes a data payload storage space of the data storage region at the expense of the longevity of the data storage region.

FIG. 3 illustrates a first example of a storage space allocation 300 that may be applied to a page of an NVM in accordance with various aspects of the disclosure. For example, the storage format control device 204 may apply the memory space allocation 300 to a page (e.g., page 0 216) of a block (e.g., block 0 210) in the NVM 208. As shown in FIG. 3, the page size 302 of the page may be L bytes. As further shown in FIG. 3, M bytes of the available L bytes may be allocated for storing a data payload (e.g., indicated as the payload area 304 in FIG. 3) and the remaining N bytes of the L bytes may be allocated for storing parity information (e.g., indicated as the parity area 306 in FIG. 3). In one example, the page size 302 may be 36,672 bytes (e.g., L=36,672). In this example, 32,768 bytes may be allocated to the payload area 304 (e.g., M=32,768), and the remaining 3,904 bytes may be allocated to the parity area 306 (e.g., L−M=N=3,904).

FIG. 4 illustrates a second example of a storage space allocation 400 that may be applied to a page of an NVM in accordance with various aspects of the disclosure. For example, the storage format control device 204 may apply the memory space allocation 400 to a page (e.g., page 1 224) of a block (e.g., block 1 212) in the NVM 208. In one example, the page size 402 of the page may be 37,952 bytes (e.g., L=37,952). In this example, 32,768 bytes may be allocated to the payload area 404 (e.g., M=32,768), and the remaining 5,184 bytes may be allocated to the parity area 406 (e.g., L−M=N=5,184). It should be noted that while the page size 402 in the example of FIG. 4 is larger than the page size 302 in the example of FIG. 3, the payload areas 304 and 404 may be equal in size. Therefore, for a given payload area, the memory space allocation 400 may provide a larger parity area (e.g., the parity area 406) than the parity area 306 in the memory space allocation 300. Therefore, in some aspects of the disclosure, the memory space allocation 400 may provide improved error correction capability relative to the memory space allocation 300.

Figure 5:
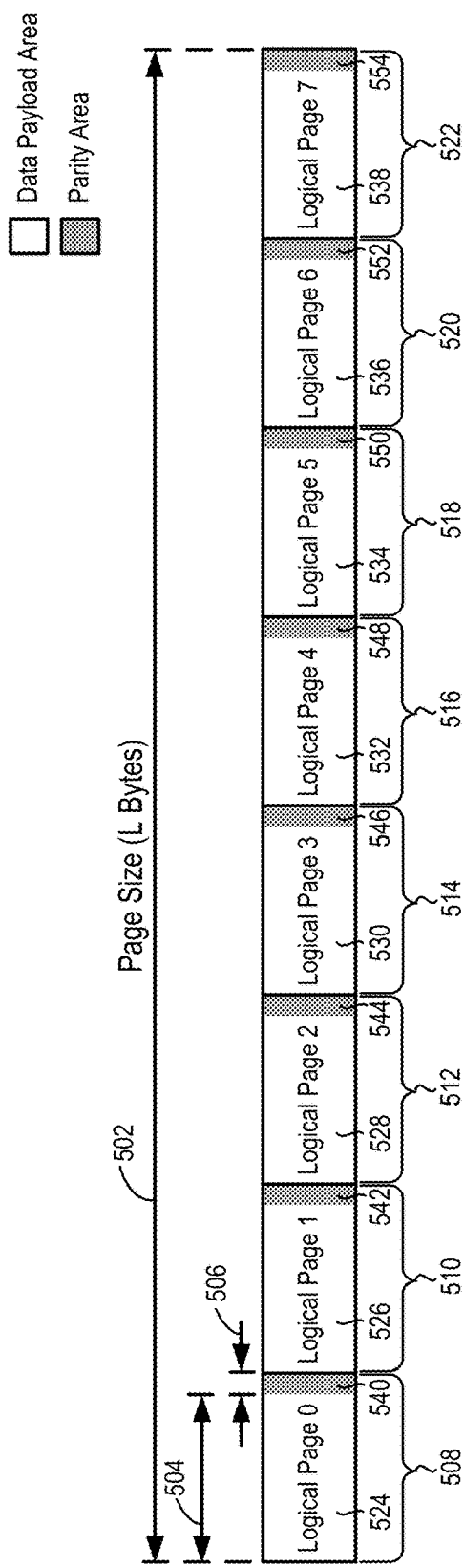
FIG. 5 illustrates an example storage format that may be applied by a storage format control device to a page of an NVM.

FIG. 5 illustrates an example storage format 500 that may be applied by the storage format control device 204 to a page of an NVM (e.g., NAND). For example, the storage format 500 may set the media format type of the memory cells of the page to the SLC media format type. In one example, the storage format 500 may be applied to a page of an NVM having the memory space allocation 300 discussed herein with reference to FIG. 3. For example, the page size 502 of the page may be L bytes. As shown in FIG. 5, the storage format control device 204 may divide the L bytes of the page to form eight groups of equal size. In the aspects described herein, each group may be referred to as a logical page (LP). In the example of FIG. 5, the L bytes (e.g., the memory cells of the page configured to store the L bytes) are divided to form logical page 0 508, logical page 1 510, logical page 2 512, logical page 3 514, logical page 4 516, logical page 5 518, logical page 6 520, and logical page 7 522. For example, each logical page may include a data payload area (e.g., data payload area 524, 526, 528, 530, 532, 534, 536, 538) having a length 504 of A bytes and a corresponding parity area (e.g., parity area 540, 542, 544, 546, 548, 550, 552, 554) having a length 506 of B bytes. Therefore, in this example, the sum of the eight data payload areas 540, 542, 544, 546, 548, 550, 552, 554 (e.g., (8)×(A bytes)) may be equal to the payload area 304 in FIG. 3. Accordingly, the sum of the eight parity areas 540, 542, 544, 546, 548, 550, 552, 554 (e.g., (8)×(B bytes)) may be equal to the parity area 306 in FIG. 3. The total number of available bytes in the page (e.g., indicated as L bytes herein) may be expressed as: (8)(A bytes)+(8)(B bytes).

In one example, with reference to FIG. 5, if the page size 502 is 36,672 bytes (e.g., L=36,672), each data payload area (e.g., data payload area 524, 526, 528, 530, 532, 534, 536, 538) may have 4,096 bytes (e.g., A=4096) and each corresponding parity area (e.g., parity area 540, 542, 544, 546, 548, 550, 552, 554) may have 488 bytes (e.g., B=488). Accordingly, in this example, the total number of available bytes in the page (e.g., indicated as L bytes herein) may be expressed as: (8)(4096 bytes)+(8)(488 bytes)=36,672 bytes.

In another example, with reference to FIG. 5, if the page size 502 is 37,952 bytes (e.g., L=37,952), each data payload area (e.g., data payload area 524, 526, 528, 530, 532, 534, 536, 538) may have 4,096 bytes (e.g., A=4096) and each corresponding parity area (e.g., parity area 540, 542, 544, 546, 548, 550, 552, 554) may have 648 bytes (e.g., B=648). Accordingly, in this example, the total number of available bytes in the page (e.g., indicated as L bytes herein) may be expressed as: (8)(4096 bytes)+(8)(648 bytes)=37,952 bytes.

Figure 6:
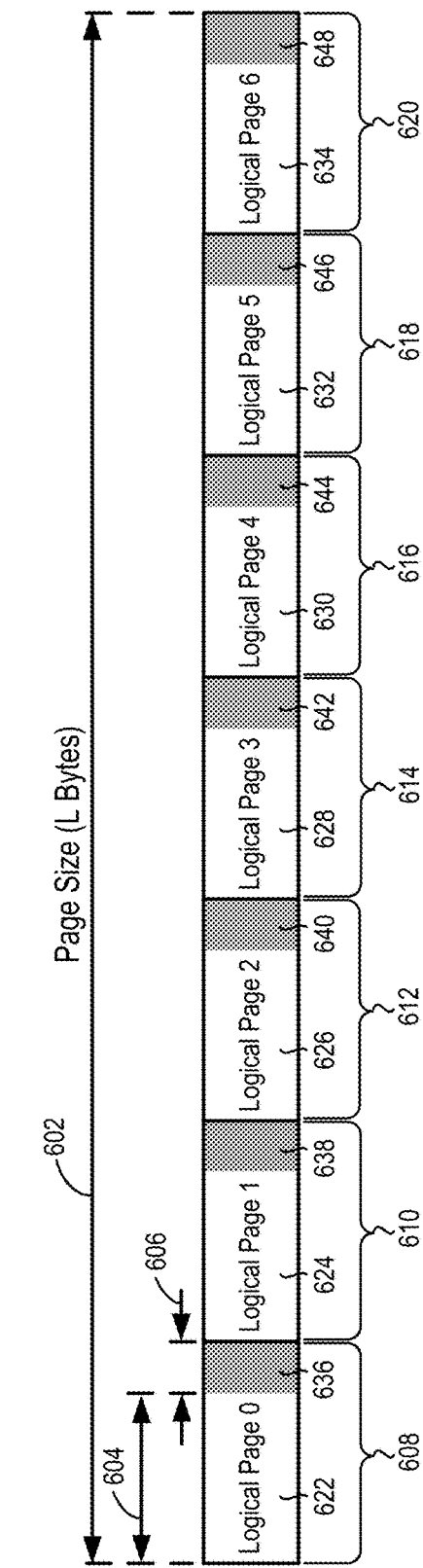
FIG. 6 illustrates an example of a horizontally scaled single-level cell (SLC) storage format that may be applied to a page of an NVM in accordance with various aspects of the disclosure.

FIG. 6 illustrates an example of a horizontally scaled SLC storage format 600 that may be applied to a page of an NVM (e.g., NAND) in accordance with various aspects of the disclosure. For example, the SLC storage format 600 may be applied to a page of an NVM having the memory space allocation 300 discussed herein with reference to FIG. 3. As shown in the example of FIG. 6, the storage format control device 204 may divide the L bytes of the page to form seven groups (also referred to as logical pages (LPs)) of equal size. In the example of FIG. 6, the L bytes (e.g., the memory cells of the page configured to store the L bytes) are divided to form logical page 0 608, logical page 1 610, logical page 2 612, logical page 3 614, logical page 4 616, logical page 5 618, and logical page 6 620. For example, each logical page may include a data payload area (e.g., data payload area 622, 624, 626, 628, 630, 632, 634) having a length 604 of A bytes and a corresponding parity area (e.g., parity area 636, 638, 640, 642, 644, 646, 648) having a length 606 of B bytes.

In one example configuration, the page size 602 may be the same as the page size 502 in FIG. 5. For example, the page size 602 may be 36,672 bytes (e.g., L=36,672). In this example, each data payload area (e.g., data payload area 622, 624, 626, 628, 630, 632, 634) in FIG. 6 may be configured to be the same size as the data payload areas (e.g., data payload area 524) in FIG. 5. For example, each data payload area (e.g., data payload area 622, 624, 626, 628, 630, 632, 634) in FIG. 6 may have 4,096 bytes (e.g., A=4096). The remaining 8,000 bytes in the page (e.g., L-7(A)=36,672 bytes-7(4096) bytes=8,000 bytes) may be used for storing parity information. Therefore, in this example, each corresponding parity area (e.g., parity area 636, 638, 640, 642, 644, 646, 648) may have approximately 1,142 bytes (e.g., B=(8,000 bytes)/7≈1,142 bytes).

It should be noted that the data payload areas (e.g., data payload area 622, 624, 626, 628, 630, 632, 634) in the horizontally scaled SLC storage format 600 and the data payload areas (e.g., data payload area 524, 526, 528, 530, 532, 534, 536, 538) in the SLC storage format 500 are equal in size. However, since the horizontally scaled SLC storage format 600 includes one less logical page than the SLC storage format 500, the horizontally scaled SLC storage format 600 provides a larger parity area (e.g., parity area 636, 638, 640, 642, 644, 646, 648) for each data payload area as compared to the parity areas (e.g., parity area 540, 542, 544, 546, 548, 550, 552, 554) in the SLC storage format 500.

Figure 7:
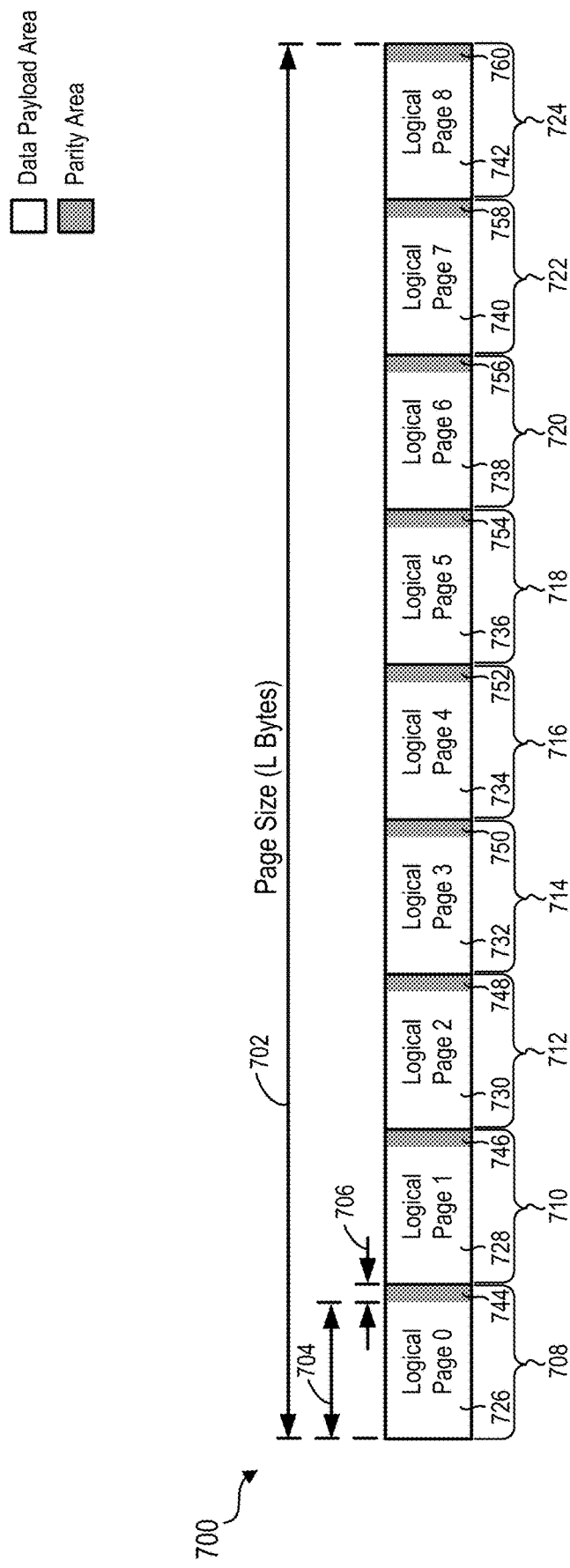
FIG. 7 illustrates an example of a horizontally scaled SLC storage format that may be applied to a page of an NVM in accordance with various aspects of the disclosure.

FIG. 7 illustrates an example of a horizontally scaled single-level cell (SLC) storage format 700 that may be applied to a page of an NVM (e.g., a NAND device) in accordance with various aspects of the disclosure. For example, the SLC storage format 700 may be applied to a page of an NVM having the memory space allocation 400 discussed herein with reference to FIG. 4. As shown in the example of FIG. 7, the storage format control device 204 may divide the L bytes of the page to form nine groups (also referred to as logical pages (LPs)) of equal size. In the example of FIG. 7, the L bytes (e.g., the memory cells of the page configured to store the L bytes) are divided to form logical page 0 708, logical page 1 710, logical page 2 712, logical page 3 714, logical page 4 716, logical page 5 718, logical page 6 720, logical page 7 722, and logical page 8 724. For example, each logical page may include a data payload area (e.g., data payload area 726, 728, 730, 732, 734, 736, 738, 740, 742) having a length 704 of A bytes and a corresponding parity area (e.g., parity area 744, 746, 748, 750, 752, 754, 756, 758, 760) having a length 706 of B bytes.

In one example configuration, the page size 702 may be the same as the page size 502 in FIG. 5. For example, the page size 702 may be 37,952 bytes (e.g., L=37,952). In this example, each data payload area (e.g., data payload area 726, 728, 730, 732, 734, 736, 738, 740, 742) in FIG. 7 may be configured to be the same size as the data payload areas (e.g., data payload area 524) in FIG. 5. For example, each data payload area (e.g., data payload area 726, 728, 730, 732, 734, 736, 738, 740, 742) in FIG. 7 may have 4,096 bytes (e.g., A=4096). The remaining 1,088 bytes in the page (e.g., L-9(A)=37,952 bytes-9(4096) bytes=1,088 bytes) may be used for storing parity information. Therefore, in this example, each corresponding parity area (e.g., parity area 744, 746, 748, 750, 752, 754, 756, 758, 760) may have approximately 120 bytes (e.g., B=(1,088 bytes)/9≈120 bytes).

It should be noted that the data payload areas (e.g., data payload area 726, 728, 730, 732, 734, 736, 738, 740, 742) in the horizontally scaled SLC storage format 700 and the data payload areas (e.g., data payload area 524, 526, 528, 530, 532, 534, 536, 538) in the SLC storage format 500 are equal in size. However, since the horizontally scaled SLC storage format 700 includes one additional logical page than the SLC storage format 500, the horizontally scaled SLC storage format 700 provides a smaller parity area (e.g., parity area 744, 746, 748, 750, 752, 754, 756, 758, 760) for each data payload area as compared to the parity areas (e.g., parity area 540, 542, 544, 546, 548, 550, 552, 554) in the SLC storage format 500.

FIG. 8 (including FIGS. 8A through 8E) illustrates examples of storage formats for an NVM in accordance with various aspects of the disclosure. In some aspects of the disclosure, FIG. 8A may represent an example of a default storage format 800 applied to a page in an NVM. As previously described, the page in the NVM may represent a set of memory cells (also referred to as a wordline) and the page size 802 of the page may be L bytes. As shown in the example configuration of FIG. 8A, the L bytes of the page (e.g., the memory cells of the page) may be divided to form eight groups of equal size, such as the first group 806 (also referred to as group 0) and the eighth group 808 (also referred to as group 8). Moreover, in the default storage format 800, each memory cell of the page may be configured as a quad-level cell (QLC). Accordingly, each memory cell may store four bits. As shown in FIG. 8A, each of the four bits stored at a memory cell of a group may correspond to a different logical page (LP). For example, a first bit of a memory cell in the first group 806 may correspond to lower logical page 0 (LP0), a second bit of the memory cell in the first group 806 may correspond to a middle logical page 0 (MP0), a third bit of the memory cell in the first group 806 may correspond to an upper logical page 0 (UP0), and a fourth bit of the memory cell in the first group 806 may correspond to a top logical page 0 (TP0).

In the default storage format 800, a portion of the available storage space in each logical page may be allocated for storing data bits (also referred to as a data payload area), while the remaining portion of the available storage space in each logical page may be allocated for storing parity information (also referred to as a parity area). In some aspects of the disclosure, the parity information may include parity bits (also referred to as error correcting code (ECC) bits). In some aspects of the disclosure, each logical page in the default storage format 800 may have the same length, such as the length 804. In one example, similar to the configuration in FIG. 5, if the page size 802 is 36,672 bytes (e.g., L=36,672), each logical page may include a data payload area of 4,096 bytes (e.g., A=4096) and a corresponding parity area of 488 bytes (e.g., B=488). Accordingly, in this example, the total number of available bytes in each row of logical pages (e.g., the row 810) may be expressed as: (8)(4096 bytes)+(8)(488 bytes)=36,672 bytes.

Figure 8A:
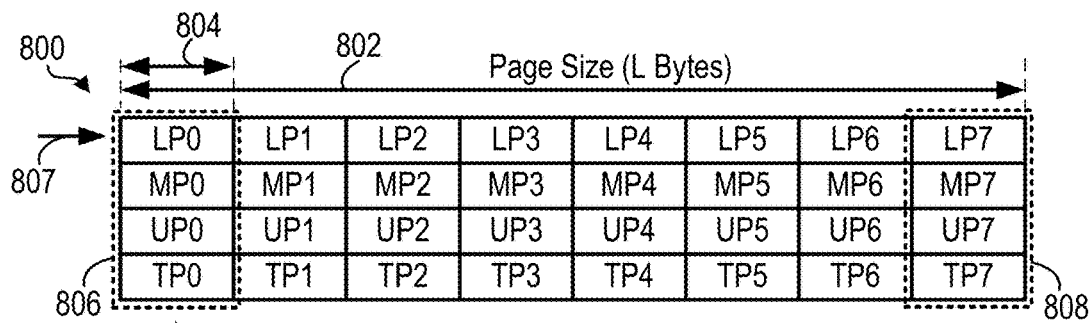
FIG. 8 (including FIGS. 8A through 8E) illustrates examples of storage formats for an NVM in accordance with various aspects of the disclosure.

The default storage format 800 in FIG. 8A may be considered to have two dimensions. For example, a first dimension (also referred to as the horizontal dimension) of the default storage format 800 may refer to the number of logical pages in each row (e.g., row 807) of the default storage format 800. A second dimension (also referred to as the vertical dimension) of the default storage format 800 may refer to the number of logical pages in each column (e.g., the logical pages LP0, MP0, UP0, and TP0 in the column 809) of the default storage format 800. The terms horizontal dimension and vertical dimension as used herein, while they may appear to imply a physical relationship as shown in FIGS. 8A to 8E, refer only to first and second dimensions of a storage region that are scalable features of that storage region. The first or horizontal dimension can refer to the number of logical pages in a page, composed of a preselected number of multilevel storage cells. The second or vertical dimension can refer to the number of storage levels in one of the multilevel storage cells. Thus, horizontal dimension scaling, as used herein, can refer to scaling the number of logical pages used in a given page. On the other hand, vertical dimension scaling, as used herein, can refer to scaling the number of bits used per storage cell in the given page. As described with reference to FIGS. 8B to 8E herein, the default storage format 800 may be scaled in the horizontal dimension and/or the vertical dimension according to storage reliability and longevity requirements of each storage component in an NVM.

In some aspects of the disclosure, the storage format control device 204 may scale the default storage format 800 in the horizontal dimension by increasing or decreasing the number of logical pages in each row of the default storage format 800. In some aspects, the storage format control device 204 may maintain the size of the data payload in each logical page when scaling (e.g., increasing or decreasing) the default storage format 800 in the horizontal dimension. In some aspects, the storage format control device 204 may scale the default storage format 800 in the vertical dimension to increase or decrease the number of bits stored in each memory cell. In some aspects, as described herein, the storage format control device 204 may combine both the horizontal and vertical scaling to achieve finer granularity storage when changing the storage format of a page in an NVM. In such aspects, the storage format control device 204 may configure the storage format of a page to achieve a maximum storage efficiency of the page, while extending the longevity (also referred to as endurance) of the NVM.

Figure 8B:
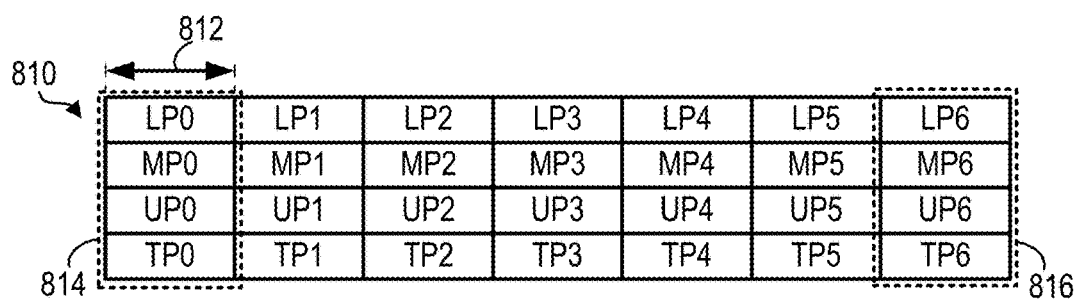

FIG. 8B illustrates an example of a horizontally scaled storage format 810 for a page in an NVM in accordance with various aspects of the disclosure. As shown in the example of FIG. 8B, the controller may scale down (e.g., decrease) the number of logical pages in each row of the default storage format 800. For example, the storage format control device 204 may scale down the horizontal dimension of the default storage format 800 to include seven logical pages (e.g., LP0 to LP6) in each row as shown in the horizontally scaled storage format 810 of FIG. 8B. In one aspect, the storage format control device 204 may perform such horizontal scaling in a manner similar to the example described with respect to FIG. 6. Since each row (e.g., row 807) of the horizontally scaled storage format 810 includes one less logical page than the default storage format 800, the size 812 of each logical page in the horizontally scaled storage format 810 may be larger than the size 804 of each logical page in the default storage format 800. The larger size 812 of each logical page in the horizontally scaled storage format 810 may enable each logical page to include a larger parity area for a data payload as compared to each logical page of the default storage format 800. In some aspects of the disclosure, the payload area in each logical page of the default storage format 800 may be equal to the payload area in each logical page of the horizontally scaled storage format 810.

Therefore, in some aspects of the disclosure, the storage format control device 204 may scale down the default storage format 800 in the horizontal dimension as shown in FIG. 8B to decrease the ECC code rate. For example, the ECC code rate may be decreased for a logical page by increasing the parity area (e.g., increasing the number of ECC parity bits) for a given data payload in the logical page.

In the horizontally scaled storage format 810, it should be noted that the storage format control device 204 has not applied any vertical scaling with respect to the default storage format 800. Therefore, similar to the default storage format 800, each memory cell of the page is a QLC. Accordingly, each memory cell of the page may store four bits. As shown in FIG. 8B, each of the four bits in a memory cell may correspond to a different logical page. For example, a first bit of a memory cell in the first group 814 may correspond to lower page 0 (LP0), a second bit of the memory cell in the first group 814 may correspond to a middle page 0 (MP0), a third bit of the memory cell in the first group 814 may correspond to an upper page 0 (UP0), and a fourth bit of the memory cell in the first group 814 may correspond to a top page 0 (TP0).

Figure 8C:
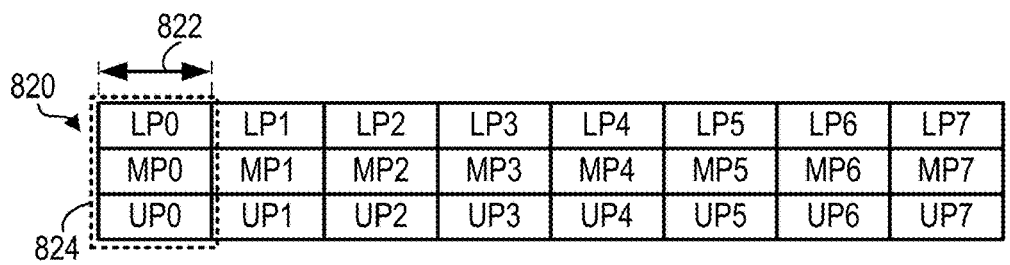

FIG. 8C illustrates an example of a vertically scaled storage format 820 for an NVM in accordance with various aspects of the disclosure. As previously described, a page in the NVM may represent a set of memory cells (also referred to as a wordline) and the page size 802 of the page may be L bytes. In some aspects, the storage format control device 204 may scale down (e.g., decrease) the vertical dimension of the default storage format 800 by configuring each memory cell as a triple-level cell (TLC). Accordingly, as shown in FIG. 8C, each memory cell may store three bits. As further shown in FIG. 8C, each of the three bits stored at a memory cell may correspond to a different logical page (LP). For example, a first bit of a memory cell in the first group 824 may correspond to lower logical page 0 (LP0), a second bit of the memory cell in the first group 824 may correspond to a middle logical page 0 (MP0), and a third bit of the memory cell in the first group 824 may correspond to an upper logical page 0 (UP0).

In the vertically scaled storage format 820, it should be noted that the storage format control device 204 has not applied any horizontal scaling with respect to the default storage format 800. Therefore, in some aspects of the disclosure, the size 822 of each logical page in the vertically scaled storage format 820 may be equal to the size 804 of each logical page in the default storage format 800.

Figure 8D:
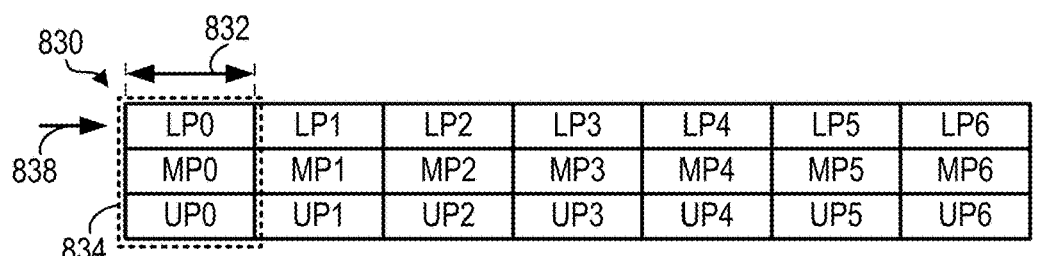

FIG. 8D illustrates an example of a horizontally and vertically scaled storage format 830 for an NVM in accordance with various aspects of the disclosure. As shown in the example of FIG. 8D, the storage format control device 204 may scale down (e.g., decrease) the number of logical pages in each row of the default storage format 800. For example, the storage format control device 204 may scale down the horizontal dimension of the default storage format 800 to include seven logical pages (e.g., LP0 to LP6) in each row as shown in the horizontally and vertically scaled storage format 830 of FIG. 8D. In one aspect, the storage format control device 204 may perform such horizontal scaling in a manner similar to the example described with respect to FIG. 6. Since each row of the horizontally and vertically scaled storage format 830 includes one less logical page than the default storage format 800, the size 832 of each logical page in the horizontally and vertically scaled storage format 830 may be larger than the size 804 of each logical page in the default storage format 800. The larger size 832 of each logical page in the horizontally and vertically scaled storage format 830 may enable each logical page to include a larger parity area for a data payload as compared to each logical page of the default storage format 800. In some aspects of the disclosure, the payload area in each logical page of the default storage format 800 may be equal to the payload area in each logical page of the horizontally scaled storage format 830.

As further shown in FIG. 8D, the storage format control device 204 may also scale down (e.g., decrease) the vertical dimension of the default storage format 800 by configuring each memory cell as a triple-level cell (TLC). Accordingly, as shown in FIG. 8D, each memory cell may store three bits. As shown in FIG. 8D, each of the three bits stored at a memory cell may correspond to a different logical page (LP). For example, a first bit of a memory cell in the first group 834 may correspond to lower logical page 0 (LP0), a second bit of the memory cell in the first group 834 may correspond to a middle logical page 0 (MP0), and a third bit of the memory cell in the first group 834 may correspond to an upper logical page 0 (UP0). It should be understood that by scaling down the vertical dimension of the storage format 800, for example, the reliability of the associated data storage region may be improved.

Figure 8E:
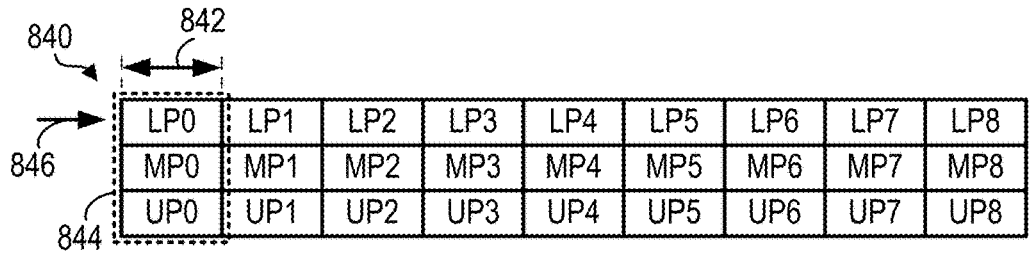

FIG. 8E illustrates an example of a horizontally and vertically scaled storage format 840 for an NVM in accordance with various aspects of the disclosure. As shown in the example of FIG. 8E, the storage format control device 204 may scale up (e.g., increase) the number of logical pages in each row of the default storage format 800. For example, the storage format control device 204 may scale up the horizontal dimension of the default storage format 800 to include nine logical pages (e.g., LP0 to LP8) in each row as shown in the horizontally and vertically scaled storage format 840 of FIG. 8E. In one aspect, the storage format control device 204 may perform such horizontal scaling in a manner similar to the example described with respect to FIG. 7. Since each row of the horizontally and vertically scaled storage format 840 includes one additional logical page than the default storage format 800, the size 842 of each logical page in the horizontally and vertically scaled storage format 840 may be smaller than the size 804 of each logical page in the default storage format 800. The smaller size 842 of each logical page in the horizontally and vertically scaled storage format 830 may result in each logical page having a smaller parity area for a data payload as compared to each logical page of the default storage format 800. In some aspects of the disclosure, the payload area in each logical page of the default storage format 800 may be equal to the payload area in each logical page of the horizontally scaled storage format 840.

As further shown in FIG. 8E, the storage format control device 204 may also scale down (e.g., decrease) the vertical dimension of the default storage format 800 by configuring each memory cell as the TLC media format type. Accordingly, as shown in FIG. 8E, each memory cell may store three bits. As shown in FIG. 8E, each of the three bits stored at a memory cell may correspond to a different logical page (LP). For example, a first bit of a memory cell in the first group 844 may correspond to lower logical page 0 (LP0), a second bit of the memory cell in the first group 844 may correspond to a middle logical page 0 (MP0), and a third bit of the memory cell in the first group 844 may correspond to an upper logical page 0 (UP0).

As described herein, the storage format control device 204 may perform horizontal scaling with respect to a default storage format (e.g., the default storage format 800) for a page in an NVM to achieve different storage formats. In one example, the storage format control device 204 may perform horizontal scaling to achieve a storage format (e.g., the storage format 810) that includes fewer logical pages with larger parity areas as compared to the default storage format. In another example, the storage format control device 204 may perform horizontal scaling to achieve a storage format (e.g., the storage format 840) that includes more logical pages with smaller parity areas as compared to the default storage format. Since the horizontal scaling may increase or decrease the size of the parity area for a data payload in each logical page, the storage format control device 204 may perform horizontal scaling to achieve a desired ECC format type for a page in an NVM.

In one example configuration, a default storage format obtained by dividing L bytes of a page into eight logical pages (e.g., the storage format 800) may be identified as an 8/8 ECC format type. Other storage formats achieved by horizontally scaling such a default storage format may be identified as an x/8 ECC format type, where x represents the number of logical pages resulting from a horizontal scaling operation. For example, the storage format 840 in FIG. 8E including the nine logical pages (e.g., x=9) in each row (e.g., row 846) may be said to have a 9/8 ECC format type. As another example, the storage format 830 in FIG. 8D including the seven logical pages (e.g., x=7) in each row (e.g., row 838) may be said to have a 7/8 ECC format type.

In accordance with the aspects described herein, an x/8 ECC format type where x<8 may improve the storage reliability of a page in an NVM at the expense of storage efficiency. In other words, the number of parity bits for a page may be increased while the data storage capacity of the page may be decreased (e.g., due to a reduction in the number of logical pages). This scenario can be observed in the example of the horizontally scaled SLC storage format 600 shown in FIG. 6. Moreover, an x/8 ECC format type where x>8 may increase storage efficiency of a page in an NVM at the expense of storage reliability. In other words, the data storage capacity of a page may be increased (e.g., due to an increase in the number of logical pages) while the number of parity bits for the page may be decreased. This scenario can be observed in the example of the horizontally scaled SLC storage format 700 shown in FIG. 7.

Figure 9:
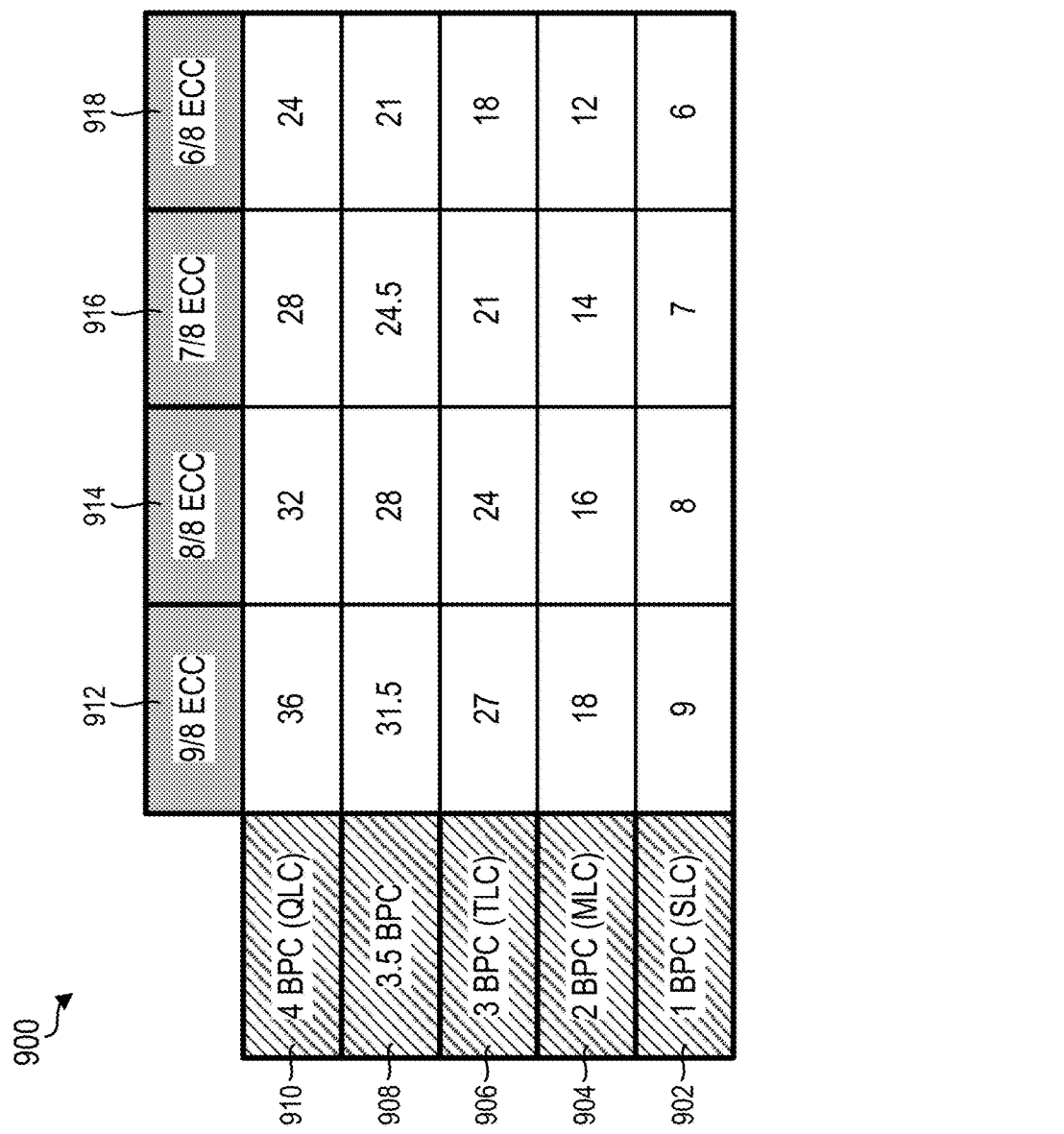
FIG. 9 illustrates an exemplary diagram indicating example storage formats that may be applied to a page of an NVM in accordance with various aspects of the disclosure.

FIG. 9 illustrates an exemplary diagram 900 indicating example storage formats that may be applied to a page of an NVM (e.g., an NVM, such as a NAND) in accordance with various aspects of the present disclosure. In some aspects of the disclosure, the storage format control device 204 may select and/or apply the example storage formats described herein with respect to FIG. 9.

As shown in FIG. 9, the storage format control device 204 may select a storage format for a page in an NVM by configuring the media format type of the memory cells of the page and/or the ECC format type applied to the page. In some aspects, for example, the storage format control device 204 may configure the media format type of the memory cells of the page as the SLC type 902 (e.g., the memory cells of the page may store one bit per cell (1 BPC)), the MLC type 904 (e.g., the memory cells of the page may store two bits per cell (2 BPC)), the TLC type 906 (e.g., the memory cells of the page may store three bits per cell (3 BPC)), a fractional level cell type 908 (e.g., the memory cells of the page may store 3.5 bits per cell (3.5 BPC)), or the QLC type 910 (e.g., the memory cells of the page may store four bits per cell (4 BPC)). In some aspects, for example, the storage format control device 204 may select the 9/8 ECC format type 912, the 8/8 ECC format type 914, the 7/8 ECC format type 916, or the 6/8 ECC format type 918. As described herein, the 8/8 ECC format type 914 may represent a default storage format type (e.g., the default storage format type 800).

The exemplary diagram 900 indicates the possible number of logical pages that can be configured in a page of an NVM for a given media format type and an ECC format type. In some aspects of the disclosure, the number of logical pages indicated in the diagram 900 may refer to logical pages that include the same data payload size (e.g., a data payload size of 4096 bytes). In some aspects of the disclosure, the number of logical pages in different columns of the diagram 900 may refer to logical pages that include parity areas of different sizes (e.g., as a result of horizontal scaling as described herein). In a first example, with reference to the diagram 900, if the storage format control device 204 configures the media format type of the memory cells of a page as the QLC type 910 and applies the 8/8 ECC format type 914, the page may include 32 logical pages. This configuration may represent the default storage format 800 previously discussed with reference to FIG. 8. For example, it can be seen that the default storage format 800 includes four rows each containing eight logical pages (e.g., 4×8=32 logical pages). In a second example, with reference to the diagram 900, if the storage format control device 204 configures the media format type of the memory cells of a page as the SLC type 902 and applies the 9/8 ECC format type 912, the page may include nine logical pages. In accordance with the aspects described herein, the parity areas included in each of the nine logical pages of the second example may be smaller than the parity areas included in each of the 32 logical pages of the first example.

In some aspects of the disclosure, the storage format control device 204 may select a storage format for one or more pages of an NVM based on one or more criteria. In one aspect, the criteria may include one or more performance metrics of a page. For example, the one or more criteria may include a bit error rate (BER), a bit error count, a number of program-erase cycles, an ECC decoding latency, a programming duration, an erase cycle duration, a read sense duration, and/or any other data that may indicate the reliability and/or longevity of a storage media (e.g., a page of an NVM).

In one example implementation, the criteria for selecting the storage format for a page may be based on the BER of the page and the storage format control device 204 may apply a storage format according to the BER of the page. The storage format control device 204 may obtain the BER of the page by decoding a codeword stored in the page and determining the number of failed bits (e.g., error bits) that were in the codeword. The storage format control device 204 may then determine the ratio of the number of failed bits to the number of bits in the codeword to obtain the BER. In some aspects of the disclosure, the storage format control device 204 may monitor (e.g., track) the BER of one or more pages in the NVM 208.

In one example, the storage format control device 204 may apply a first storage format when the BER exceeds a first threshold, a second storage format when the BER exceeds a second threshold, and so on. The storage format control device 204 may select a storage format with a lower storage efficiency and/or a more robust ECC format as the BER for the page increases. For example, the storage format control device 204 may monitor the BER for a page configured with a default storage format. In one example, the default storage format may be the default storage format 800 in FIG. 8A. Accordingly, with reference to FIG. 9, the page may be configured with the QLC media format type 910 and the 8/8 ECC format type 914. Therefore, with reference to FIG. 9, the page may include 32 logical pages. In this example, if the BER for the page exceeds a first threshold value, the storage format control device 204 may horizontally scale the default storage format down to the 7/8 ECC format type 914 to improve storage reliability. Therefore, with reference to FIG. 9, the page may include 28 logical pages. Continuing with this example, if the BER for the page still exceeds the first threshold value, the storage format control device 204 may further horizontally scale the storage format down to the 6/8 ECC format type 914 to further improve storage reliability. Therefore, with reference to FIG. 9, the page may include 24 logical pages. If the BER for the page continues to exceed the first threshold value, the storage format control device 204 may vertically scale the storage format down by configuring the memory cells of the page as the TLC type 906. Therefore, with reference to FIG. 9, the page may include 18 logical pages. By converting the memory cells of the page from the QLC type 910 to the TLC type 906, the page may be more robust and resilient to errors despite maintaining the same ECC format type (e.g., the 6/8 ECC format type 918).

In some aspects of the disclosure, the previously described first threshold may be set to a BER that represents the maximum BER that a storage region may have to be considered a usable storage region (e.g., a good block in a NAND). In other words, storage regions having a BER exceeding such maximum BER may be considered unusable (e.g., a bad block in a NAND). Therefore, the previously described approach may enable a storage region in an NVM (e.g., NVM 208) to achieve a BER that prevents the one or more storage regions from being considered unusable, thereby improving the longevity of the NVM. Moreover, by scaling down the storage format of a page as previously described to improve the reliability of the page, it can be appreciated that the read/write performance (e.g., decoding speed) of the page may also be improved.

In some aspects of the disclosure, the storage format control device 204 may track the BER of a page in real time. In these aspects, the storage format control device 204 may dynamically select and apply an appropriate storage format to the page according to a current value of the BER based on the aspects described here.

In some aspects of the disclosure, the storage format control device 204 may be configured to select a storage format for a page that provides the most storage efficiency. For example, with reference to FIG. 9, if a first storage format (e.g., a storage format that applies the fractional level cell media format type 908 and the 8/8 ECC format type 914) may provide 28 logical pages and a second storage format (e.g., a storage format that applies the TLC type 906 and the 9/8 ECC format type 912) may provide 27 logical pages, the storage format control device 204 may prefer to apply the first storage format. For example, the fractional level cell media format type 908 may be applied by using full sequence read and advanced signal processing techniques.

In some aspects of the disclosure, the storage format control device 204 may be configured to select a storage format that provides the most program-erase cycles for the page. In these aspects, for example, if the second storage format in the previous example provides more program-erase cycles for the page than the first storage format, the storage format control device 204 may select the second storage format. Therefore, by selecting the second storage format providing a greater number of program-erase cycles, the storage format control device 204 may increase the longevity of the page.

As previously described, the aspects herein may improve the performance and longevity of an NVM. The horizontal dimension and/or the vertical dimension of the storage formats described herein may allow each storage region (e.g., page, block, etc.) of the NVM 208 to have a unique ECC strength, codeword structure, and/or a media storage type. The storage format control device 204 may determine the most appropriate storage format for a data storage region to meet the endurance and reliability requirements of the data storage region. The storage format control device 204 may further determine a storage format for each storage region to maximize the user data over the life of the NVM 208.

For example, if one or more pages of a block in a NAND begin to perform below an acceptable level such that a controller of the NAND would treat the block as a bad block, the disclosed storage format control device 204 may apply the aspects described herein to improve the performance (e.g., storage reliability) of the one or more pages. As a result of the improved performance, the block may no longer be considered a bad block (e.g., the controller 206 may continue to use the block) and, therefore, may increase the longevity of the storage device.

In some aspects of the disclosure, the techniques described herein may be applied during the manufacturing stage of a data storage system (e.g., SSD). For example, a storage format control device (e.g., the storage format control device 204) may identify one or more regions of an NVM that are considered unusable (e.g., one or more bad blocks in a NAND) and may apply a scaled storage format to enable use of such one or more regions of an NVM.

Figure 10A:
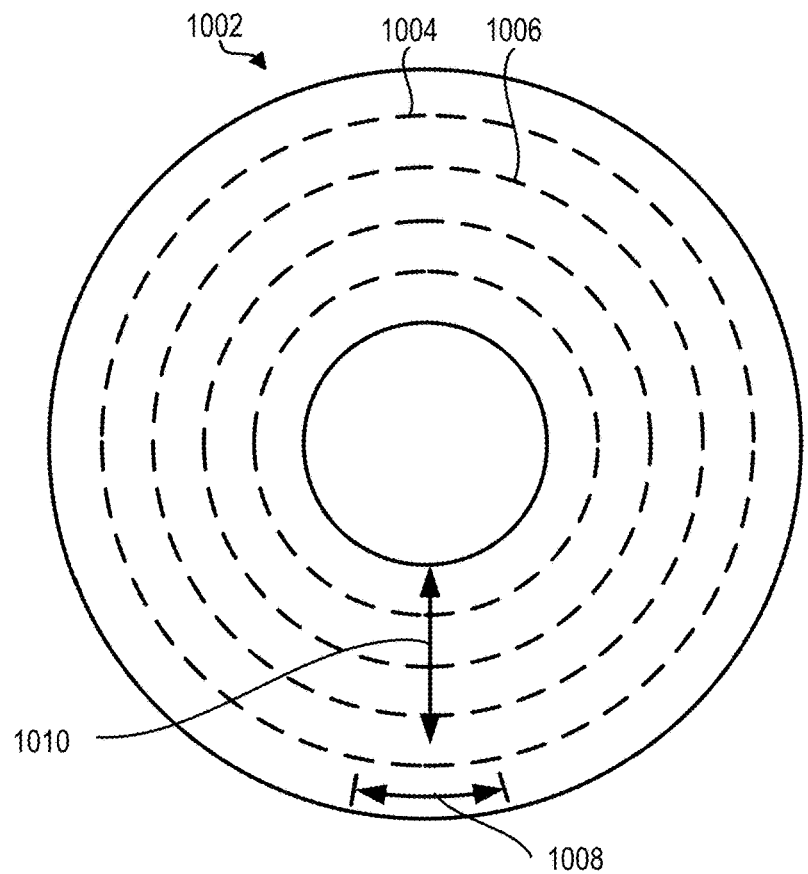
FIG. 10 (including FIGS. 10A and 10B) illustrates an example magnetic storage medium according to one or more aspects of the disclosure.
Figure 10B:
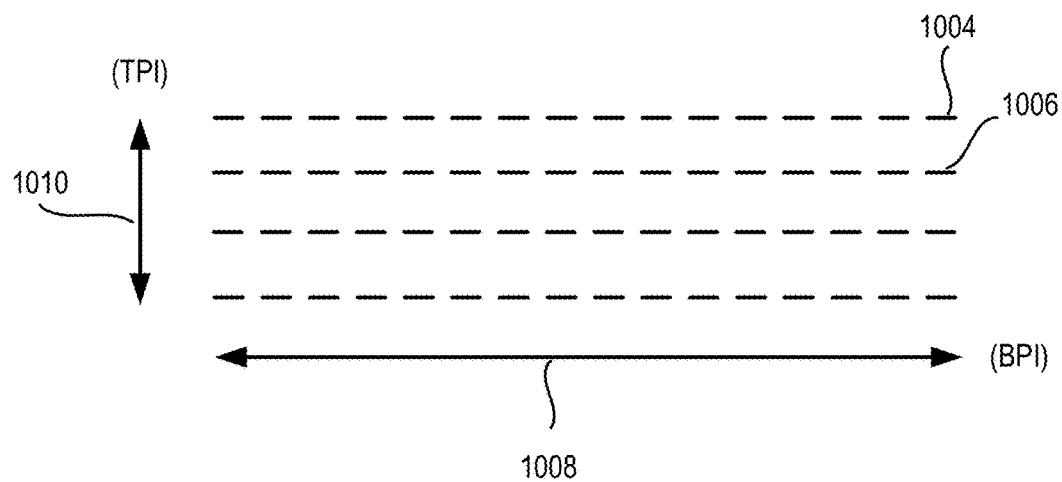

FIG. 10 (including FIGS. 10A and 10B) illustrates an example magnetic storage medium 1002 according to one or more aspects of the disclosure. FIG. 10A illustrates a top view of the example magnetic storage medium 1002 according to one or more aspects of the disclosure. For example, the magnetic storage medium 1002 may be implemented in a hard disk drive (HDD) and the magnetic storage medium 1002 may spin when data is written to (or read from) the magnetic storage medium 1002. In some examples, and as shown in FIG. 10, the magnetic storage medium 1002 may be configured to store information on one or more concentric circular tracks (e.g., tracks 1004, 1006). The density of information (e.g., bits) stored along a track may be expressed as bits per inch (BPI) and the density of tracks in the magnetic storage medium 1002 may be expressed as tracks per inch (TPI).

FIG. 10B illustrates a conceptual schematic view of tracks of the example magnetic storage medium 1002 according to one or more aspects of the disclosure. In the conceptual view, the tracks (e.g., 1004, 1006) have been redrawn as straight lines spaced apart with the track spacing. In this embodiment, the BPI may indicate the number of bits that can be stored along a track with a track length (e.g., the first length 1008) of one inch, and the TPI may indicate the number of tracks within a radial-length (e.g., the second length 1010) of one inch as measured along the radius of the magnetic storage medium 1002.

In some aspects of the disclosure, a data storage system (e.g., an HDD) may apply the example storage formats and/or the scaling operations described herein to a magnetic storage medium (e.g., the magnetic storage medium 1002). For example, with reference to the default storage format 800 in FIG. 8A, the first dimension (also referred to as the horizontal dimension) of the default storage format 800 may correspond to a tangential direction of the magnetic storage medium 1002, where the tangential direction (e.g., along the first length 1008) includes a number of bits that can be stored along a portion of a track (e.g., BPI) on the magnetic storage medium 1002. The second dimension (also referred to as the vertical dimension) of the default storage format 800 may correspond to a radial direction of the magnetic storage medium 1002, where the radial direction (e.g., along the second length 1010) includes a number of tracks based on the TPI value that can be stored along a given length of a portion of the magnetic storage medium 1002. Accordingly, the data storage system may perform the horizontal dimension scaling described herein by increasing or decreasing (e.g., controlling) the BPI of the magnetic storage medium 1002 and/or may perform the vertical dimension scaling described herein by increasing or decreasing (e.g., controlling) the TPI of the magnetic storage medium 1002. In some examples, the data storage system may define a number of distinct storage regions (e.g., also referred to as sectors) on the magnetic storage medium 1002, where each distinct storage region includes portions of a number of tracks. The data storage system may increase the storage capacity of each distinct storage region by increasing the TPI of the magnetic storage medium 1002 and may decrease the storage capacity of each distinct storage region by decreasing the TPI of the magnetic storage medium 1002.

One example HDD configured to scale storage formats may implement shingled magnetic recording (SMR). Shingled magnetic recording (SMR) technology may provide an increase in areal density compared to same-generation drives using traditional magnetic recording (CMR) technology. Physically, this can be done by writing the data sequentially, then overlapping (or "shingling") it with another track of data. By repeating this process, more data tracks can be placed on each magnetic surface. Traditional magnetic recording places gaps between recording tracks on HDDs to account for Track mis-registration (TMR) budget. These separators impact areal density, as portions of the platter are not being fully utilized. Shingled magnetic recording removes the gaps between tracks by sequentially writing tracks in an overlapping manner, forming a pattern similar to shingles on a roof.

Because of the shingled format of SMR, data streams are generally organized and written sequentially to the media. While the methods of SMR implementation may differ, the data nonetheless is generally written to the media sequentially. Consequently, should a particular track need to be modified or rewritten, the entire "band" of tracks (zone) is rewritten. Because the modified data is potentially under another "shingle" of data, direct modification may not be permitted, unlike traditional CMR drives. In the case of SMR, the entire row of shingles above the modified track needs to be rewritten in the process. Thus, SMR technology has some parallels to flash memory and also can benefit from the approaches described herein for making adjustments to the granularity of the storage formats implemented in the NVMs.

In some examples, the data storage system (e.g., SSD 104 reconfigured as data storage system that may include solid state storage and/or magnetic storage components) may implement shingled magnetic recording (SMR) such that the previously described tracks (e.g., tracks 1004, 1006) on the magnetic storage medium 1002 are at least partially overlapped, which may further increase the storage density (e.g., areal density) of the magnetic storage medium 1002. In these examples, the data storage system may perform the horizontal dimension scaling described herein by increasing or decreasing the bit density along a track and/or may perform the vertical dimension scaling described herein by increasing or decreasing the track density in a radial direction across tracks. As discussed above for embodiments involving SSDs and flash memory, the scaling can be based on a performance capability of the storage region to obtain a modified storage format. The performance capability can be determined based on one or more performance metrics of the storage region such as the bit error rate (BER) in a storage region (e.g., sector or zone) of the magnetic medium of the HDD. Some bands (or zones), in some cases, may exhibit a certain behavioral characteristic with regard to areal density (TPI*BPI) including impact to BER. Thus, some customer applications may desire to trade off BER capability for areal density for example. This disclosure contemplates a possible method to manifest that tradeoff both from drive to drive in the manufacturing process, and from zone to zone within a given drive.

The present disclosure describes systematic approaches for improving the maximum efficiency of an SSD/HDD and for extending the longevity of the SSD/HDD. In some aspects of the disclosure, such systematic approaches may include adjustments to the granularity of the storage formats implemented in the NVMs using horizontal scaling, vertical scaling, and/or some combinations of horizontal and vertical scaling. In accordance with the various aspects of the disclosure, the processes and apparatuses described herein may enable the reuse of regions of NVMs (e.g., bad blocks in a NAND flash memory) that would otherwise be considered unusable in data storage systems. In some aspects of the disclosure, the reuse of these regions may include writing data to these regions and/or reading data from these regions. In some scenarios, the reuse of these regions may improve the overprovisioning of storage space in data storage systems, which may improve the performance of the data storage systems.

Example Apparatus

Figure 11:
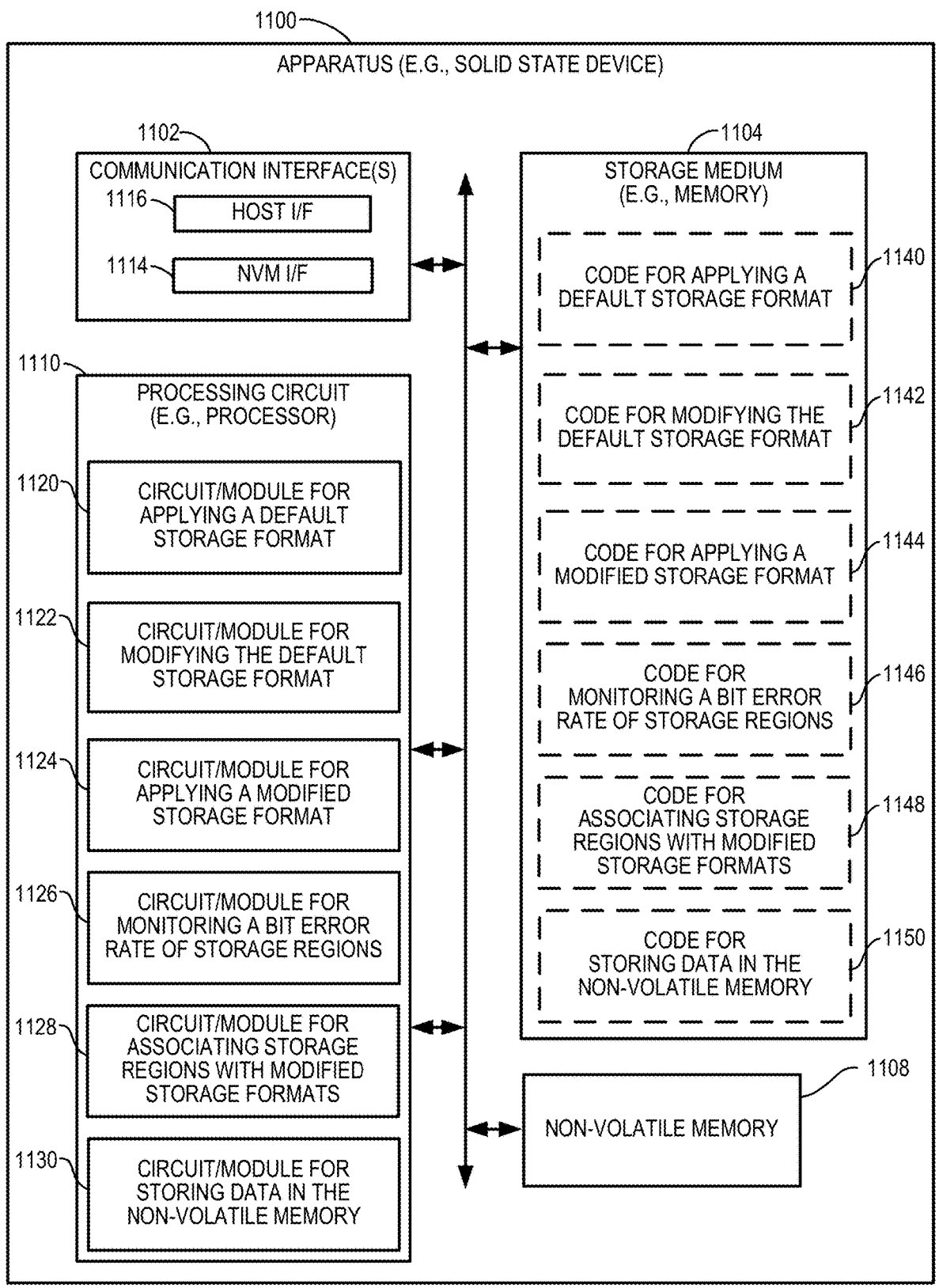
FIG. 11 illustrates an embodiment of an apparatus according to one or more aspects of the disclosure.

FIG. 11 illustrates an embodiment of an apparatus 1100 according to one or more aspects of the disclosure. The apparatus 1100 could embody or be implemented within a controller, an SSD, a solid state drive, a host device, an NVM device, a NAND die, or some other type of device that supports data storage. In various implementations, the apparatus 1100 could embody or be implemented within a computing device, a personal computer, a portable device, or workstation, a server, a personal digital assistant, a digital camera, a digital phone, an entertainment device, a medical device, or any other electronic device that stores data.

The apparatus 1100 includes a communication interface 1102, a storage medium 1104, an NVM (e.g., an NVM memory circuit) 1108, and a processing circuit 1110 (e.g., at least one processor and/or other suitable circuitry). These components can be coupled to and/or placed in electrical communication with one another via a signaling bus or other suitable component, represented generally by the connection lines in FIG. 11. The signaling bus may include any number of interconnecting buses and bridges depending on the specific application of the processing circuit 1110 and the overall design constraints. The signaling bus links together various circuits such that each of the communication interface 1102, the storage medium 1104, and the NVM 1108 are coupled to and/or in electrical communication with the processing circuit 1110. The signaling bus may also link various other circuits (not shown) such as timing sources, peripherals, voltage regulators, and power management circuits, which are well known in the art, and therefore, will not be described any further.

The communication interface 1102 provides a means for communicating with other apparatuses over a transmission medium. In some implementations, the communication interface 1102 includes circuitry and/or programming (e.g., a program) adapted to facilitate the communication of information bi-directionally with respect to one or more devices in a system. In some implementations, the communication interface 1102 may be configured for wire-based communication. For example, the communication interface 1102 could be a bus interface, a send/receive interface, or some other type of signal interface including drivers, buffers, or other circuitry for outputting and/or obtaining signals (e.g., outputting signal from and/or receiving signals into an integrated circuit). The communication interface 1102 serves as one example of a means for receiving and/or a means for transmitting.

The NVM 1108 may represent one or more non-volatile memory devices. In some implementations, the NVM 1108 and the storage medium 1104 are implemented as a common memory component. The NVM 1108 may also be used for storing data that is manipulated by the processing circuit 1110 or some other component of the apparatus 1100.

The storage medium 1104 may represent one or more computer-readable, machine-readable, and/or processor-readable devices for storing programming, such as processor executable code or instructions (e.g., software, firmware), electronic data, databases, or other digital information. The storage medium 1104 may also be used for storing data that is manipulated by the processing circuit 1110 when executing programming. The storage medium 1104 may be any available media that can be accessed by a general purpose or special purpose processor, including portable or fixed storage devices, optical storage devices, and various other mediums capable of storing, containing or carrying programming.

By way of example and not limitation, the storage medium 1104 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 1104 may be embodied in an article of manufacture (e.g., a computer program product). By way of example, a computer program product may include a computer-readable medium in packaging materials. In view of the above, in some implementations, the storage medium 1104 may be a non-transitory (e.g., tangible) storage medium. For example, the storage medium 1104 may be a non-transitory computer-readable medium storing computer-executable code, including code to perform operations as described herein.

The storage medium 1104 may be coupled to the processing circuit 1110 such that the processing circuit 1110 can read information from, and write information to, the storage medium 1104. That is, the storage medium 1104 can be coupled to the processing circuit 1110 so that the storage medium 1104 is at least accessible by the processing circuit 1110, including examples where at least one storage medium is integral to the processing circuit 1110 and/or examples where at least one storage medium is separate from the processing circuit 1110 (e.g., resident in the apparatus 1100, external to the apparatus 1100, distributed across multiple entities, etc.).

Programming stored by the storage medium 1104, when executed by the processing circuit 1110, causes the processing circuit 1110 to perform one or more of the various functions and/or process operations described herein. For example, the storage medium 1104 may include operations configured for regulating operations at one or more hardware blocks of the processing circuit 1110, as well as to utilize the communication interface 1102 for wireless communication utilizing their respective communication protocols.

The processing circuit 1110 is generally adapted for processing, including the execution of such programming stored on the storage medium 1104. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 1110 is arranged to obtain, process and/or send data, control data access and storage, issue commands, and control other desired operations. The processing circuit 1110 may include circuitry configured to implement desired programming provided by appropriate media in at least one example. For example, the processing circuit 1110 may be implemented as one or more processors, one or more controllers, and/or other structure configured to execute executable programming Examples of the processing circuit 1110 may include a general purpose processor, a digital signal processor (DSP), an application-specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 1110 may also be implemented as a combination of computing components, such as a combination of a controller and a microprocessor, a number of microprocessors, one or more microprocessors in conjunction with an ASIC and a microprocessor, or any other number of varying configurations. These examples of the processing circuit 1110 are for illustration and other suitable configurations within the scope of the disclosure are also contemplated.

According to one or more aspects of the disclosure, the processing circuit 1110 may be adapted to perform any or all of the features, processes, functions, operations and/or routines for any or all of the apparatuses described herein. For example, the processing circuit 1110 may be configured to perform any of the steps, functions, and/or processes described with respect to FIGS. 11-13. As used herein, the term "adapted" in relation to the processing circuit 1110 may refer to the processing circuit 1110 being one or more of configured, employed, implemented, and/or programmed to perform a particular process, function, operation and/or routine according to various features described herein.

Figure 12:
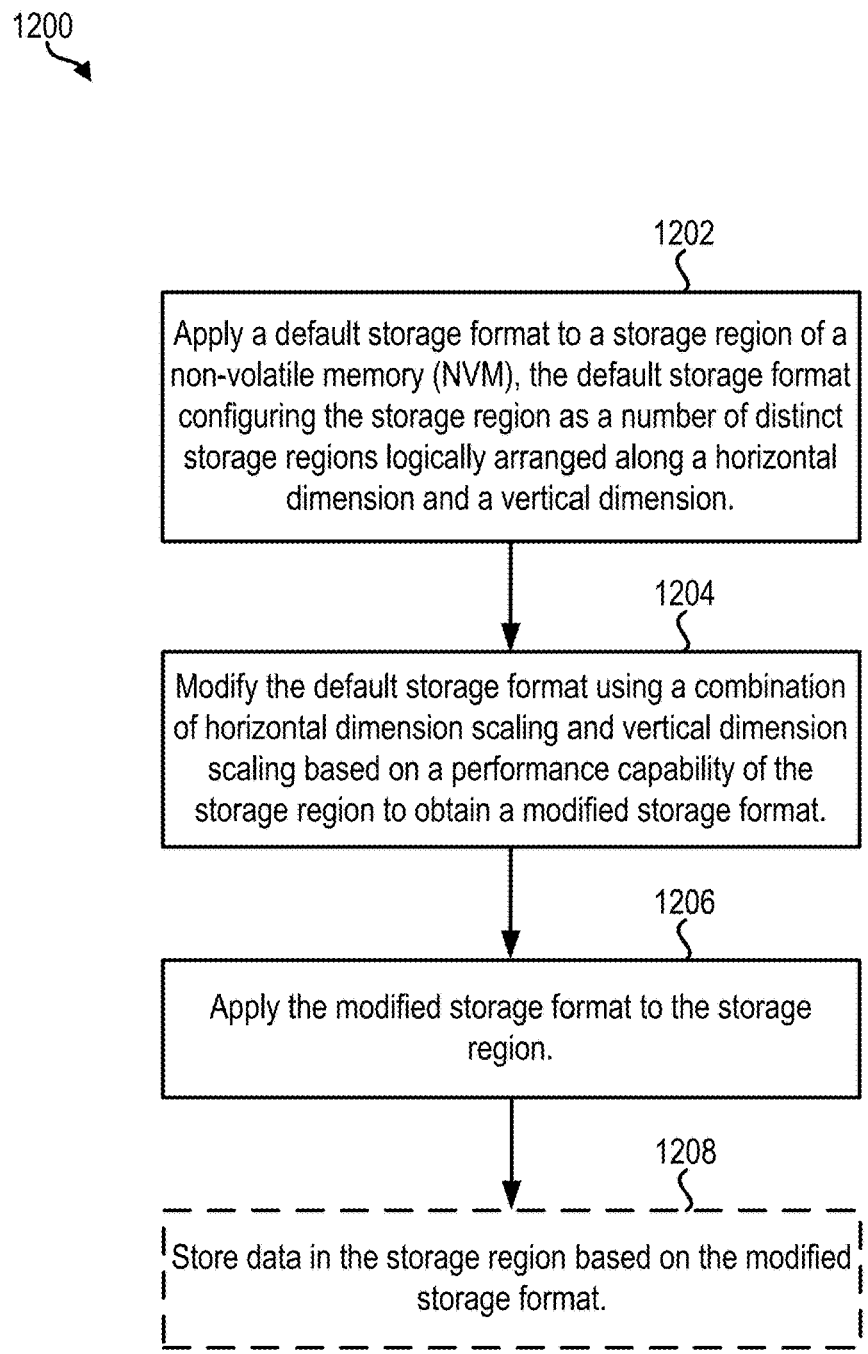
FIG. 12 broadly summarizes exemplary operations for use by a controller of an SSD.
Figure 13:
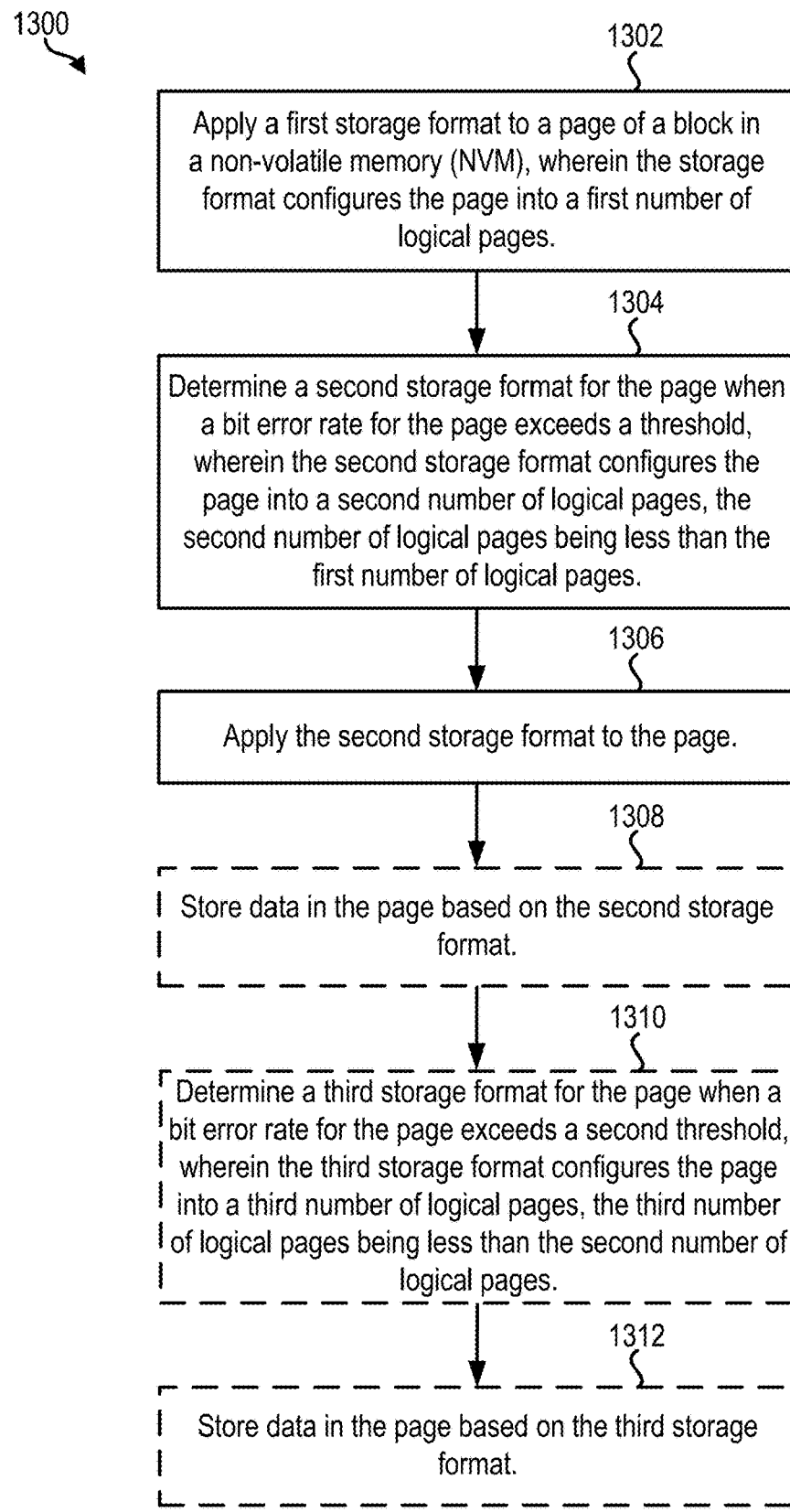
FIG. 13 broadly summarizes exemplary operations for use by a controller of an SSD.

The processing circuit 1110 may be a specialized processor, such as an application-specific integrated circuit (ASIC) that serves as a means for (e.g., structure for) carrying out any one of the operations described in conjunction with FIGS. 11-13. The processing circuit 1110 serves as one example of a means for sending and/or a means for receiving. In various implementations, the processing circuit 1110 may provide and/or incorporate, at least in part, the functionality described above for the controller 108 or the SSD 104 of FIG. 1.

According to at least one example of the apparatus 1100, the processing circuit 1110 may include one or more of a circuit/module for applying a default storage format 1120, a circuit/module for modifying the default storage format 1122, a circuit/module for applying a modified storage format 1124, a circuit/module for monitoring a bit error rate of storage regions 1126, a circuit/module for associating storage regions with modified storage formats 1128, a circuit/module for storing data in the data storage device 1130. In various implementations, the circuit/module for applying a default storage format 1120, the circuit/module for modifying the default storage format 1122, the circuit/module for applying a modified storage format 1124, the circuit/module for monitoring a bit error rate of storage regions 1126, the circuit/module for associating storage regions with modified storage formats 1128, or the circuit/module for storing data in the NVM 1130 may provide and/or incorporate, at least in part, the functionality described above for the controller 108 of FIG. 1. In some aspects of the disclosure, the circuit/module for modifying the default storage format 1122 may be configured to scale the default storage format 1122 (e.g., perform horizontal dimension scaling and/or vertical dimension scaling) as described herein to provide a scaled storage format. Accordingly, in these aspects, the term modified storage format may be used interchangeably with the term scaled storage format.

As mentioned above, a program stored by the storage medium 1104, when executed by the processing circuit 1110, causes the processing circuit 1110 to perform one or more of the various functions and/or process operations described herein. For example, the program may cause the processing circuit 1110 to perform the various functions, steps, and/or processes described herein with respect to FIGS. 11-13 in various implementations. As shown in FIG. 11, the storage medium 1104 may include one or more of a code for applying a default storage format 1140, a code for modifying the default storage format 1142, a code for applying a modified storage format 1144, a code for monitoring a bit error rate of storage regions 1146, a code for associating storage regions with modified storage formats 1148, or a code for storing data in the NVM 1150. In various implementations, the code for applying a default storage format 1140, the code for modifying the default storage format 1142, the code for applying a modified storage format 1144, the code for monitoring a bit error rate of storage regions 1146, the code for associating storage regions with modified storage formats 1148, and the code for storing data in the NVM 1150 may be executed or otherwise used to provide the functionality described herein for the circuit/module for applying a default storage format 1120, the circuit/module for modifying the default storage format 1122, the circuit/module for applying a modified storage format 1124, the circuit/module for monitoring a bit error rate of storage regions 1126, the circuit/module for associating storage regions with modified storage formats 1128, the circuit/module for storing data in the NVM 1130.

First Example Process

FIG. 12 illustrates a process 1200 in accordance with some aspects of the disclosure. The process 1200 may take place within a processing circuit (e.g., the processing circuit 1010 of FIG. 10), which may be located in a controller, an SSD, a solid state drive, a host device, an NVM device, a NAND die, or some other suitable apparatus. Of course, in various aspects within the scope of the disclosure, the process 1200 may be implemented by any suitable apparatus capable of supporting memory-related operations. It should be understood that the blocks indicated with dashed lines in FIG. 12 represent optional blocks.

At block 1202, the apparatus applies a default storage format to a storage region of an NVM. The default storage format may configure the storage region as a number of distinct storage regions logically arranged along a horizontal dimension and a vertical dimension. In one example, the NVM may be a NAND device and the storage region may be a page or a block in the NAND device. In another example, the NVM may include a magnetic storage medium, and the storage region may include at least one portion of the magnetic storage medium. In some aspects, the default storage format may configure the storage region as a number of distinct storage regions by dividing the storage region (e.g., a page in a NAND) into a number of distinct storage regions (e.g., logical pages).

At block 1204, the apparatus modifies (e.g., scales) the default storage format using a combination of horizontal dimension scaling and vertical dimension scaling based on a performance capability of the storage region to obtain a modified storage format (also referred to as a scaled storage format). In some aspects, the performance capability of the storage region is determined based on one or more performance metrics of the storage region. In some aspects, the one or more metrics comprises at least one of a bit error rate, a bit error count, a number of program-erase cycles, an error correction code (ECC) decoding latency, a programming duration, an erase cycle duration, or a read sense duration. In some aspects, the horizontal dimension scaling comprises controlling a number of parity bits available for each of the distinct storage regions, and the vertical dimension scaling comprises controlling a number of bits that may be stored by each memory cell of the storage region. In some aspects, the combination of horizontal dimension scaling and vertical dimension scaling reduces a storage efficiency of the storage region and increases a reliability and a longevity of the storage region. In some aspects, the modified storage format is configured to increase at least one of a longevity of the storage region of the NVM or a reliability of the storage region of the NVM relative to the default storage format.

At block 1206, the apparatus applies the modified storage format to the storage region.

At block 1208, the apparatus stores data in the storage region based on the modified storage format.

In some aspects, a process in accordance with the teachings herein may include any combination of the above operations.

Second Example Process

FIG. 13 illustrates a process 1300 in accordance with some aspects of the disclosure. The process 1300 may take place within a processing circuit (e.g., the processing circuit 1010 of FIG. 10), which may be located in a controller, an SSD, a solid state drive, a host device, an NVM device, a NAND die, or some other suitable apparatus. Of course, in various aspects within the scope of the disclosure, the process 1300 may be implemented by any suitable apparatus capable of supporting memory-related operations. It should be understood that the blocks indicated with dashed lines in FIG. 13 represent optional blocks.

At block 1302, the apparatus applies a first storage format to a page of a block in an NVM. The storage format may configure the page into a first number of logical pages.

At block 1304, the apparatus determines a second storage format for the page when a bit error rate for the page exceeds a threshold. The second storage format may configure the page into a second number of logical pages, the second number of logical pages being less than the first number of logical pages. In some aspects, the second number of logical pages has a higher ECC rate than the first number of logical pages. In some aspects, the second storage format reduces the number of bits that may be stored in each memory cell of the page relative to the first storage format. In some aspects, each of the first number of logical pages and each of the second number of logical pages are configured to store about the same amount of data. In some aspects, each of the second number of logical pages are allocated more ECC bits relative to each of the first number of logical pages.

At block 1306, the apparatus applies the second storage format to the page.

At block 1308, the apparatus stores data in the page based on the second storage format.

At block 1310, the apparatus determines a third storage format for the page when a bit error rate for the page exceeds a second threshold. The third storage format configures (e.g., divides) the page into a third number of logical pages, the third number of logical pages being less than the second number of logical pages. In some aspects, the third number of logical pages comprises a higher ECC rate than the second number of logical pages.

At block 1312, the apparatus stores data in the page based on the third storage format.

In some aspects, a process in accordance with the teachings herein may include any combination of the above operations.

Third Example Process

Figure 14:
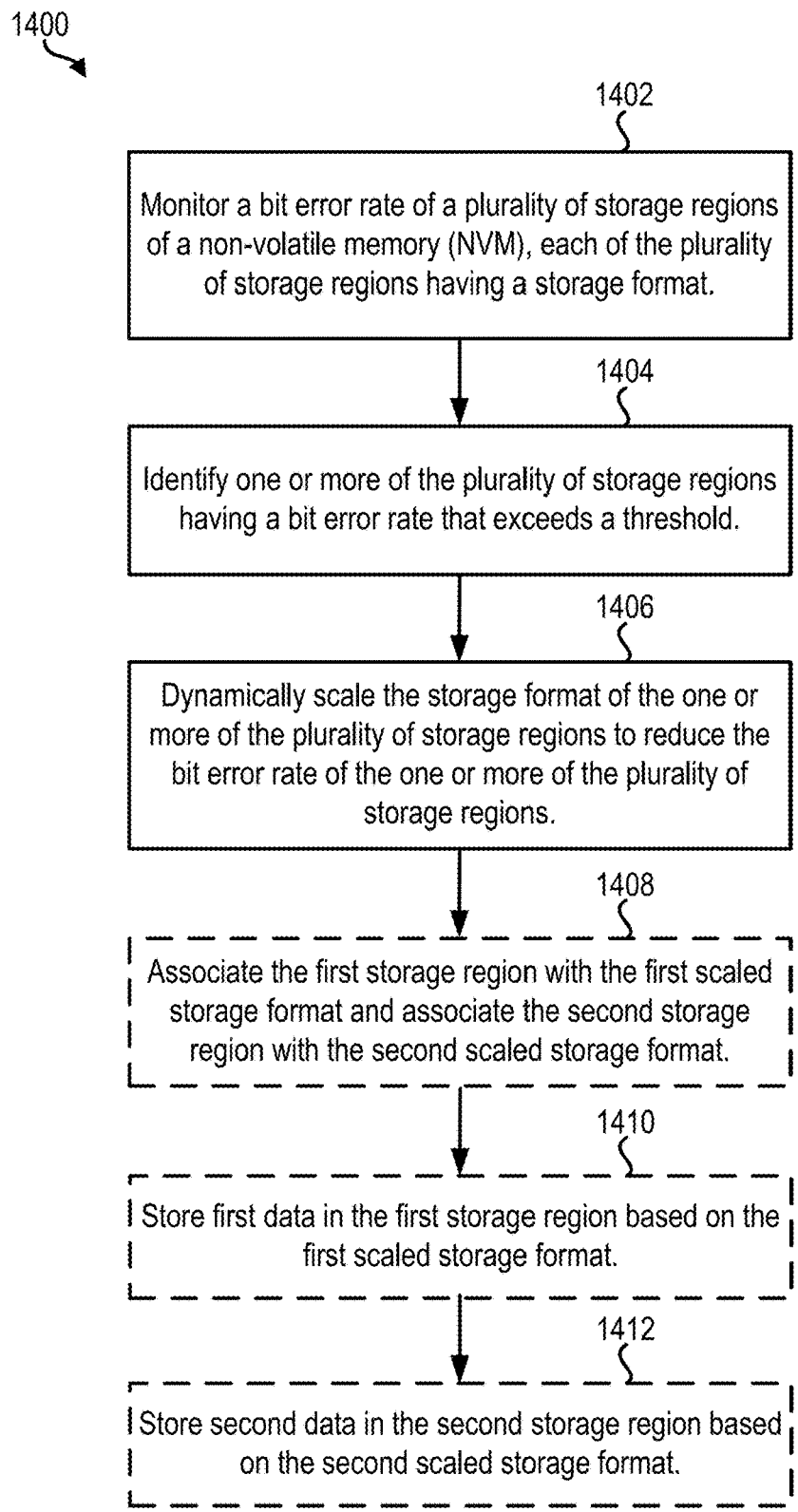
FIG. 14 broadly summarizes exemplary operations for use by a controller of an SSD.

FIG. 14 illustrates a process 1400 in accordance with some aspects of the disclosure. The process 1400 may take place within a processing circuit (e.g., the processing circuit 1010 of FIG. 10), which may be located in a controller, an SSD, a solid state drive, a host device, an NVM device, a NAND die, or some other suitable apparatus. Of course, in various aspects within the scope of the disclosure, the process 1400 may be implemented by any suitable apparatus capable of supporting memory-related operations. It should be understood that the blocks indicated with dashed lines in FIG. 14 represent optional blocks.

At block 1402, the apparatus monitors a bit error rate of a plurality of storage regions of an NVM, each of the plurality of storage regions having a storage format. In some aspects, each of the plurality of storage regions are about equal in size.

At block 1404, the apparatus identifies one or more of the plurality of storage regions having a bit error rate that exceeds a threshold.

At block 1406, the apparatus dynamically scales the storage format of the one or more of the plurality of storage regions to reduce the bit error rate of the one or more of the plurality of storage regions. In some aspects, the scaled storage format reduces a storage efficiency of the one or more of the plurality of storage regions to increase a reliability of the one or more of the plurality of storage regions. In some aspects, the scaled storage format reduces a storage efficiency of the one or more of the plurality of storage regions to increase a number of parity bits available for the one or more of the plurality of storage regions. In some aspects, a first storage region of the one or more of the plurality of storage regions has a first scaled storage format and a second storage region of the one or more of the plurality of storage regions has a second scaled storage format, wherein the first scaled storage format is different from the second scaled storage format.

At block 1408, the apparatus associates the first storage region with the first scaled storage format and associates the second storage region with the second scaled storage format.

At block 1410, the apparatus stores first data in the first storage region based on the first scaled storage format.

At block 1412, the apparatus stores second data in the second storage region based on the second scaled storage format.

In some aspects, a process in accordance with the teachings herein may include any combination of the above operations.

Additional Aspects

The examples set forth herein are provided to illustrate certain concepts of the disclosure. The apparatuses, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The term "about the same" or "about equal" as used herein means either the same, equal, up to 1 percent different, up to 5 percent different, or up to 10 percent different. The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of a, b, or c" or "a, b, c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A data storage apparatus, comprising:
    a non-volatile memory (NVM);
    a processor coupled to the NVM and configured to:
        apply a default storage format to a storage region of the NVM, the default storage format configuring the storage region as a number of distinct storage regions logically arranged along a horizontal dimension and a vertical dimension;
        measure a performance metric for the storage region that is representative of a duration of a storage operation applied to the storage region;
        determine, based on the performance metric, whether the storage region performs below a threshold performance level;
        modify the default storage format, in response to a determination that the storage region performs below the threshold performance level, to obtain a modified storage format using a combination of horizontal dimension scaling and vertical dimension scaling;
        apply the modified storage format to the storage region, to thereby reconfigure the storage region; and
        store data in the storage region in accordance with the modified storage format.

2. The data storage apparatus of claim 1, wherein the storage operation comprises at least one of a read operation, a program operation, an error correction operation, or an erase operation.

3. The data storage apparatus of claim 2, wherein the performance metric comprises at least one of an error correction code (ECC) decoding duration, a programming duration, an erase cycle duration, or a read sense duration.

4. The data storage apparatus of claim 1, wherein the processor is further configured to apply the horizontal dimension scaling by controlling a number of parity bits available for each of the distinct storage regions, and is further configured to apply the vertical dimension scaling by controlling a number of bits that may be stored by each memory cell of the storage region.

5. The data storage apparatus of claim 1, wherein the NVM comprises a NAND device and the storage region is a page or a block in the NAND device.

6. The data storage apparatus of claim 1, wherein the NVM comprises a magnetic storage medium and the storage region includes at least one portion of the magnetic storage medium.

7. The data storage apparatus of claim 6, wherein the processor is further configured to apply the horizontal dimension scaling by controlling a number of bits per inch (BPI) stored in one or more tracks of the at least one portion of the magnetic storage medium, and wherein the processor is further configured to apply the vertical dimension scaling by controlling a number of tracks per inch (TPI) used for the at least one portion of the magnetic storage medium.

8. The data storage apparatus of claim 7, wherein the processor is further configured to store information on the magnetic storage medium using shingled magnetic recording.

9. A method of operating a data storage apparatus, comprising:
    applying a first storage format to a page of a block in a non-volatile memory (NVM), wherein the first storage format configures the page into a first number of logical pages having a first number of parity bits;

measuring a performance metric for the page that is representative of a duration of a storage operation applied to the page;

determining, based on the performance metric, whether the page meets a condition indicative of an unusable storage region;

determining, in response to a determination that the page meets the condition indicative of an unusable storage region, a second storage format for the page, wherein the second storage format configures the page into a second number of logical pages having a second number of parity bits;

applying the second storage format to the page, to thereby reconfigure the page; and storing data in the page in accordance with the second storage format.

10. The method of claim 9, wherein the storage operation comprises at least one of a read operation, a program operation, an error correction operation, or an erase operation.

11. The method of claim 10, wherein the performance metric comprises at least one of an error correction code (ECC) decoding duration, a programming duration, an erase cycle duration, or a read sense duration.

12. The method of claim 9, wherein each of the second number of logical pages are allocated more error correction code (ECC) bits relative to each of the first number of logical pages.

13. A data storage apparatus, comprising:

a non-volatile memory (NVM) comprising a plurality of storage regions;

means for monitoring a performance metric that is representative of a duration of a storage operation applied within the plurality of storage regions of the NVM, each of the plurality of storage regions having a storage format comprising a media format and an error correction code (ECC) format;

means for identifying one or more of the plurality of storage regions wherein the performance metric is below a threshold performance level; and means for dynamically scaling the storage format of the one or more of the plurality of storage regions by modifying a combination of the media format and the ECC format so the performance metric is no longer below the threshold performance level.

14. The data storage apparatus of claim 1, wherein the processor is further configured to select the combination of horizontal dimension scaling and vertical dimension scaling to reconfigure the storage region so the storage region no longer performs below the performance level.

15. The data storage apparatus of claim 1, wherein the processor is further configured to modify the default storage format to comprise a fractional level cell media format.

16. The data storage apparatus of claim 1, wherein the processor is further configured to modify the default storage format using the combination of vertical and horizontal scaling set to increase a total data storage over a lifetime of the storage region.

17. The method of claim 9, wherein the determining the second storage format comprises selecting the second number of logical pages and the second number of parity bits so that the page no longer meets the condition indicative of an unusable storage region.

18. The method of claim 9, wherein the determining the second storage format further comprises configuring the page to employ a fractional level cell media format.

19. The method of claim 9, wherein the determining the second storage format further comprises selecting the second number of logical pages and the second number of parity bits to increase a total data storage over a lifetime of the page.

20. The data storage apparatus of claim 13, wherein the means for dynamically scaling includes means for selecting the combination of the media format and the ECC format so that each of the plurality of storage regions is no longer below the threshold performance level.

21. The data storage apparatus of claim 13, wherein the means for dynamically scaling the storage format comprises means for configuring the storage format to comprise a fractional level cell media format.

22. The data storage apparatus of claim 13, wherein the means for dynamically scaling the storage format comprises means for selecting the combination of the media format and the ECC format to increase a total data storage over a lifetime of the one or more of the plurality of storage regions.

* * * * *